(12) United States Patent
Alameh et al.

(10) Patent No.: US 10,425,055 B2
(45) Date of Patent: *Sep. 24, 2019

(54) ELECTRONIC DEVICE WITH IN-POCKET AUDIO TRANSDUCER ADJUSTMENT AND CORRESPONDING METHODS

(71) Applicant: Motorola Mobility LLC, Chicago, IL (US)

(72) Inventors: Rachid Alameh, Crystal Lake, IL (US); Robert Zurek, Antioch, IL (US); Jarrett Simerson, Glenview, IL (US)

(73) Assignee: Motorola Mobility LLC, Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/213,855

(22) Filed: Dec. 7, 2018

(65) Prior Publication Data

US 2019/0245502 A1    Aug. 8, 2019

Related U.S. Application Data

(63) Continuation of application No. 16/010,098, filed on Jun. 15, 2018, which is a continuation of application No. 15/887,812, filed on Feb. 2, 2018, now Pat. No. 10,171,058.

(51) Int. Cl.
*H03G 3/32* (2006.01)
*H04R 3/00* (2006.01)
*H04R 29/00* (2006.01)
*H04R 1/40* (2006.01)

(52) U.S. Cl.
CPC .............. *H03G 3/32* (2013.01); *H04R 1/406* (2013.01); *H04R 3/005* (2013.01); *H04R 29/002* (2013.01); *H04R 2499/11* (2013.01)

(58) Field of Classification Search
USPC ....... 381/56, 57, 58, 60, 328, 330, 358, 150, 381/345

See application file for complete search history.

(56) References Cited

U.S. PATENT DOCUMENTS

| | | | |
|---|---|---|---|
| 6,983,245 B1 * | 1/2006 | Jimenez Felstrom | G10L 15/10 704/226 |
| 8,204,786 B2 * | 6/2012 | LeBoeuf | G16H 10/60 705/14.66 |
| 9,813,792 B2 * | 11/2017 | Neumeyer | H04R 1/10 |
| 2016/0286313 A1 * | 9/2016 | Kofman | H04R 3/12 |

OTHER PUBLICATIONS

Laekemariam, Yosef, "NonFinal OA", U.S. Appl. No. 15/887,812, filed Feb. 2, 2018; dated May 30, 2018.
Laekemariam, Yosef, "NonFinal OA", U.S. Appl. No. 16/010,098, filed Jun. 15, 2018; dated Sep. 17, 2018.
Laekemariam, Yosef K. , "Notice of Allowance", U.S. Appl. No. 15/887,812, filed Feb. 2, 2018; dated Sep. 13, 2018.

* cited by examiner

*Primary Examiner* — Yosef K Laekemariam
(74) *Attorney, Agent, or Firm* — Philip H. Burrus, IV

(57) ABSTRACT

An electronic device includes one or more microphones, one or more sensors, and one or more processors operable with the one or more microphones and the one or more sensors. The one or more processors, upon the one or more sensors detecting the electronic device is disposed within a repository container, such as a pocket, apply an audio signal adjustment function to signals received from the one or more microphones, thereby mitigating noise in the signals caused by the repository container.

20 Claims, 7 Drawing Sheets

ELECTRONIC DEVICE WITH IN-POCKET AUDIO TRANSDUCER ADJUSTMENT AND CORRESPONDING METHODS

CROSS REFERENCE TO PRIOR APPLICATIONS

This application is a continuation application claiming priority and benefit under 35 U.S.C. § 120 from U.S. application Ser. No. 16/010,098, filed Jun. 15, 2018, which is a continuation application claiming priority and benefit under 35 USC § 120 from U.S. application Ser. No. 15/887,812, filed Feb. 2, 2018, each of which is incorporated by reference for all purposes.

BACKGROUND

Technical Field

This disclosure relates generally to electronic devices, and more particularly to electronic devices having audio transducers.

Background Art

Modern portable electronic communication devices including numerous features beyond those associated with simply making voice telephone calls. Smartphones, for example, can be used to send text messages or multimedia messages, capture videos, make financial transactions, and surf the Internet. A modern smartphone places more computing power in a pocket than was offered by large desktop computers of only a decade ago.

As the technology of these devices has advanced, so too has their feature set. For example, not too long ago all electronic devices had physical keypads. Today touch sensitive displays are more frequently seen as user interface devices. Similarly, it used to be that the only way to deliver user input to a device was with touch, either through a keypad or touch sensitive display. Today some devices are equipped with voice recognition that allows a user to speak commands to a device instead of typing them.

These smaller, yet more powerful, devices are being used for many different applications in many different environments. It would be advantageous to be able to detect certain environments and adapt performance of an electronic device to better perform in a given environment.

Figure 1:
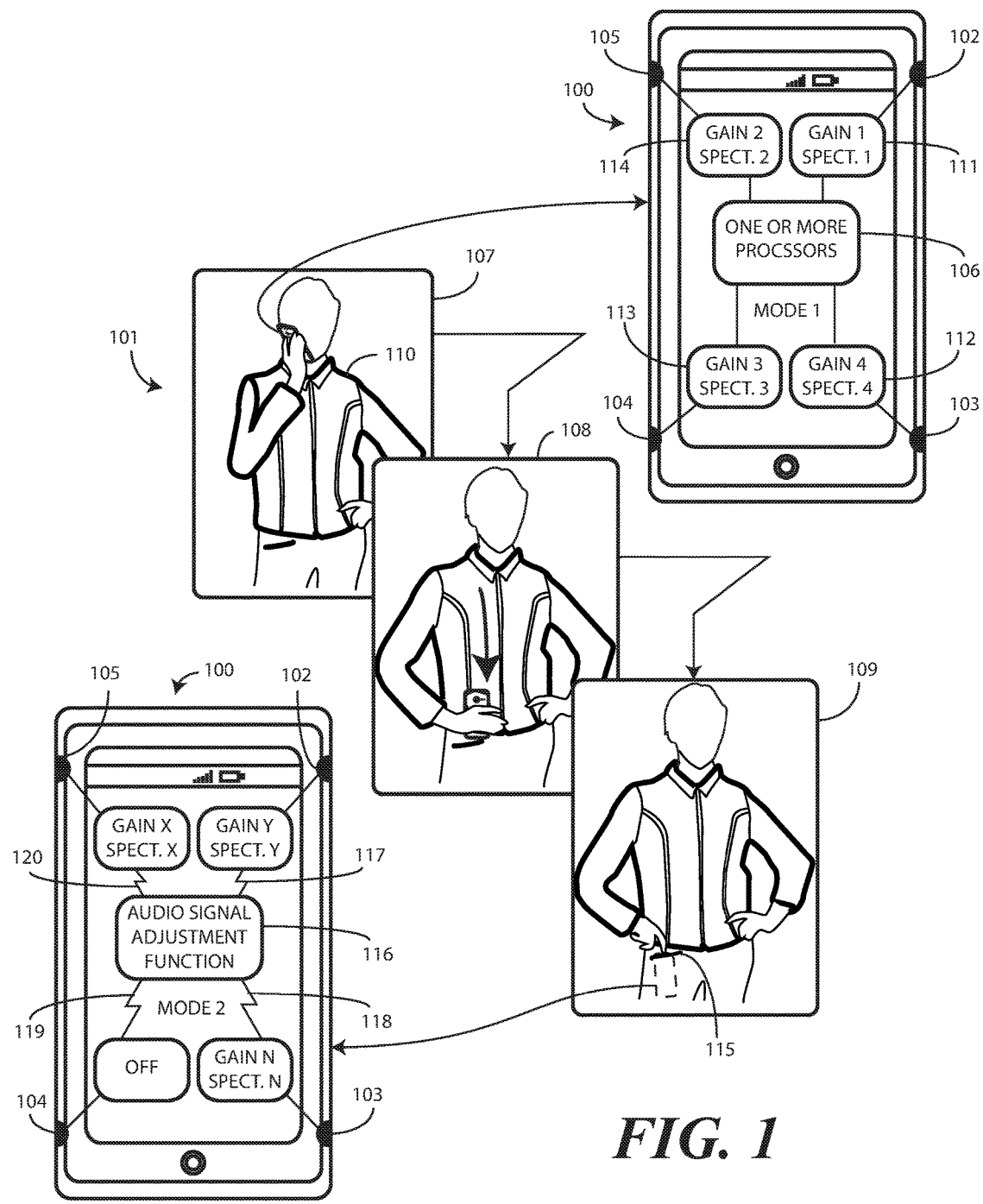
FIG. 1 illustrates one explanatory electronic device and corresponding method in accordance with one or more embodiments of the disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DRAWINGS

Before describing in detail embodiments that are in accordance with the present disclosure, it should be observed that the embodiments reside primarily in combinations of method steps and apparatus components related to the application of audio signal adjustment functions to one or more audio transducers of an electronic device when that electronic device is in an enclosed condition, such as in a pocket, purse, or other enclosed space. Any process descriptions or blocks in flow charts should be understood as representing modules, segments, or portions of code that include one or more executable instructions for implementing specific logical functions or steps in the process. Alternate implementations are included, and it will be clear that functions may be executed out of order from that shown or discussed, including substantially concurrently or in reverse order, depending on the functionality involved. Accordingly, the apparatus components and method steps have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

Embodiments of the disclosure do not recite the implementation of any commonplace business method aimed at processing business information, nor do they apply a known business process to the particular technological environment of the Internet. Moreover, embodiments of the disclosure do not create or alter contractual relations using generic computer functions and conventional network operations. Quite to the contrary, embodiments of the disclosure employ methods that, when applied to electronic device and/or user interface technology, improve the functioning of the electronic device itself by and improving the overall user experience to overcome problems specifically arising in the realm of the technology associated with electronic device user interaction.

It will be appreciated that embodiments of the disclosure described herein may be comprised of one or more conventional processors and unique stored program instructions that control the one or more processors to implement, in conjunction with certain non-processor circuits, some, most, or all of the functions of applying audio signal adjustment functions to audio transducers of an electronic device, such as one or more microphones or one or more loudspeakers, as described herein. The non-processor circuits may include, but are not limited to, a radio receiver, a radio transmitter, signal drivers, clock circuits, power source circuits, and user input devices. As such, these functions may be interpreted as steps of a method to perform audio signal adjustment functions associated with the operation of audio signal transducers. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

Embodiments of the disclosure are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions. As used herein, components may be "operatively coupled" when information can be sent between such components, even though there may be one or more intermediate or intervening components between, or along the connection path. The terms "substantially" and "about" are used to refer to dimensions, orientations, or alignments inclusive of manufacturing tolerances. Thus, a "substantially orthogonal" angle with a manufacturing tolerance of plus or minus two degrees would include all angles between 88 and 92, inclusive. Also, reference designators shown herein in parenthesis indicate components shown in a figure other than the one in discussion. For example, talking about a device (10) while discussing figure A would refer to an element, 10, shown in figure other than figure A.

Embodiments of the disclosure are operable to detect, with one or more sensors of an electronic device, whether the electronic device is in an enclosed condition. Examples of enclosed conditions include situations where the electronic device is disposed within a pocket, a purse, a backpack, a drawer, or other enclosed environment. When this occurs, in one or more embodiments one or more processors determine an audio signal adjustment function for one or more audio transducers of the electronic device in response to the enclosed condition.

Illustrating by example, consider the situation when the electronic device is situated within a pocket with a portion of the electronic device exposed from the pocket. Where one or more microphones or loudspeakers are disposed about the perimeter of the electronic device, those that are exposed from the pocket will be better situated to receive and transmit acoustic energy due to the fact that they are exposed. By contrast, those microphones and/or loudspeakers that are covered by textile material may have acoustic signals emitted therefrom or received thereby muffled, distorted, dampened, altered, or otherwise degraded.

Advantageously, in one or more embodiments the one or more processors determine an audio signal adjustment function for each audio transducer as a result of the enclosed condition. The one or more processors then apply the audio signal adjustment function to the one or more audio transducers while the electronic device is in the enclosed condition. The audio signal adjustment function adjusts performance characteristics such as volume, gain, and spectral distribution, by applying amplitude compensation, spectral equalization, compression, expansion, or other compensating adjustments to enhance the operation of each microphone or loudspeaker. In short, the application of the audio signal adjustment function allows each microphone to "hear better" in the enclosed condition. Similarly, the application of the audio signal adjustment function allows each loudspeaker to produce sounds more audible to a user so the user can hear the electronic device better when in the enclosed condition. Advantageously, embodiments of the disclosure enable the electronic device to better sense audio signals and to better communicate with the user even when in an enclosed condition, such as when disposed in a pocket or purse.

In one or more embodiments, when an enclosed condition is detected, one or more microphones are enabled to sense background acoustic signals. Embodiments of the disclosure contemplate that microphones that are covered by textile material will receive "rubbing" or "crinkling" noise or other acoustic energy that is generated when a textile material rubs against itself or the electronic device. This results in the receipt of acoustic signals being restricted. Such rubbing or crinkling noise can, in some situations, overwhelm the audio system. This can prevent or mask valid audio from being detected by impacted microphones. Consequently, voice recognition and hands free functions may struggle to operate properly when the electronic device is in an enclosed condition.

Advantageously, embodiments of the disclosure overcome these difficulties so that functionality employing the receipt or delivery of acoustic energy can better receive and deliver acoustic energy when the electronic device in the enclosed condition. In one embodiment, this occurs via a three-step process that includes detecting that the electronic device is disposed in an enclosed environment such as a pocket, a purse, etc., adaptively selecting the microphone receiving the least "rubbing" or "crinkling" or other acoustic energy that is generated when a textile material rubs against itself or the electronic device, and then calibrating, via the application of an audio signal adjustment function to overcome amplitude and spectral degradation occurring as a result of the enclosed condition.

Embodiments of the disclosure contemplate that placement of an electronic device in a pocket or purse can cause a serious issue in which the "rubbing" or "crinkling" or other acoustic energy that is generated when a textile material rubs against itself or the electronic device can "overwhelm" or saturate microphones of the electronic device. This condition can prevent one or more of the microphones from receiving acoustic energy. Embodiments of the disclosure advantageously, in one or more embodiments, adaptively selects one or more microphones that are least impacted by the "rubbing" or "crinkling" or other acoustic energy that is generated when a textile material rubs against itself or the electronic device.

This selection can occur as a function of microphone location, electronic device orientation, or other factors. Illustrating by example, if the electronic device is situated within a pocket with a portion of the electronic device exposed from the pocket, in one embodiment one or more orientation sensors or other sensors would identify the portion of the electronic device exposed from the pocket. This identification could happen via audio analysis or other sensors or a combination of the two. Thereafter, the one or more processors of the electronic device would select microphone(s) disposed along the exposed portion of the electronic device due to the fact that these microphone(s) would receive less of the "rubbing," "crinkling," other acoustic energy, or attenuation. In other embodiments, processor operations that monitor the microphones for clipping on each channel to determine which microphones receive the least "rubbing" or "crinkling" or other acoustic energy, with the microphone selection being based upon the least clipping. Other techniques for selecting the microphone(s) receiving the least "rubbing" or "crinkling" or other acoustic energy will be obvious to those of ordinary skill in the art having the benefit of this disclosure.

Detection of the enclosed condition can occur in a variety of ways. Using placement of an electronic device in a pocket as an illustrative example, in one or more embodiments the electronic device is equipped with one or more capacitive touch sensors. For example, an electronic device can be equipped with a front capacitive touch sensor, a rear capacitive touch sensor, and one or more side capacitive touch sensors. Using these three sensors, touch—or the lack thereof—can be determined to define a powerful system that is able to distinguish between, for example, when the electronic device is disposed within a pocket, is placed on a surface, or is being grasped by a hand. This system can be supplemented, augmented, or replaced by additional systems, including those based upon accelerometer data, light sensing data, "muffled" sound signals, temperature measurements, and so forth. Many of these techniques will be described in the disclosure below. Still others will be obvious to those of ordinary skill in the art having the benefit of this disclosure.

In one or more embodiments, once the enclosed condition is detected, the one or more processors determine the audio signal adjustment function by performing what is referred to herein as an "acoustic sweep." In one or more embodiments, the acoustic sweep is performed by emitting predefined signals from one or more loudspeakers of the electronic device and measuring an attenuation of those signals as received by one or more microphones of the electronic device. Said differently, in one embodiment the acoustic sweep comprises delivering, from one or more audio output devices, a predefined acoustic output to one or more microphones and measuring, with one or more processors, attenuation of the predefined acoustic output occurring between the one or more audio output devices and the one or more microphones. The response coefficients can then be used to define the audio signal adjustment function.

These audio sweeps can be performed on a periodic basis. This helps to ensure that the audio signal adjustment function is only applied when the electronic device is in the enclosed position. In one or more embodiments, when the enclosed condition ceases, application of the audio signal adjustment function also ceases. Said differently, in one or more embodiments, the one or more processors also detect, using one or more sensors, cessation of the enclosed condition. When this occurs, the one or more processors terminate application of the audio signal adjustment function to the signals received from the one or more audio transducers.

Application of the audio signal adjustment function works, in one or more embodiments, to alter one or more of audio gain, spectrum equalization, or transfer function. This enables microphones or loudspeakers to better deliver and receive acoustic energy through the walls of the container enclosing the electronic device. In one or more embodiments, the audio signal adjustment function comprises an amplitude compensation factor for signals received by microphones or delivered by loudspeakers. The amplitude compensation can increase or otherwise alter gain to once again allow these devices to receive and deliver acoustic energy, as well as to acoustically overcome sound attenuation due to enclosed condition. In one or more embodiments, the audio signal adjustment function comprises spectral equalization. When audio sweeps are preformed and detect acoustic energy degradation due to an enclosed condition, a function that is the inverse of the degradation can be applied. This inverse function applies, in one or more embodiments, correction factors specific to clothes or other containers that may impact the received or delivered audio "spectral function." Of course, the amplitude correction and spectral equalization can be applied in combination as well.

In one or more embodiments, an electronic device comprises one or more microphones, one or more sensors, and one or more processors operable with the one or more microphones and the one or more sensors. In one or more embodiments, the one or more processors, upon the one or more sensors detecting the electronic device is disposed within a repository container such as a pocket or purse, apply an audio signal adjustment function to signals received from the one or more microphones. The application of the audio signal adjustment function advantageously works to mitigate noise and attenuation in the signals caused by the repository container.

Advantageously, embodiments of the disclosure uniquely detect an enclosed condition. Once this enclosed condition is detected, embodiments of the disclosure can determine an acoustic signal adjustment function. This can occur by adaptively detecting least "rubbing" or "crinkling" or other acoustic energy during motion, as identified by one or more microphones an/or an accelerometer. Alternatively, this can occur by comparing signals received by one or more microphones. Alternatively, the direction of gravity can be used to determine which microphone or loudspeaker is most likely to be the best at receiving sounds in the enclosed environment. Other sensors that can assist include ambient light sensor, pressure sensor, imagers, or other sensors that will be obvious to those of ordinary skill in the art having the benefit of this disclosure. In one or more embodiments, one or more processors can select microphones receiving a least amount of "rubbing" or "crinkling" or other acoustic energy and disable others.

As noted above, the one or more processors can perform acoustic sweeps upon detecting the enclosed condition. This can include delivering a predefined acoustic output and measuring the return signals received with one or more microphones. This technique can be used to determine the audio signal adjustment function. If the audio signal adjustment function changes as a result of movement of the electronic device or movement of the enclosure, the function can be updated. In one or more embodiments, the audio signal adjustment function is updated every time motion is detected by an accelerometer, as this can indicate a changing environment. When the enclosed condition is no longer present, the application of the audio signal adjustment function can be removed.

Turning now to FIG. 1, illustrated therein is one explanatory electronic device 100 and corresponding method 101 in accordance with one or more embodiments of the disclosure. The electronic device 100 includes one or more audio transducers 102, 103, 104, 105. The audio transducers 102, 103, 104, 105 can each comprise a microphone, a loudspeaker, or combinations thereof. While four audio transducers 102, 103, 104, 105 are shown in FIG. 1, in other embodiments the electronic device 100 could include more than four audio transducers 102, 103, 104, 105 or fewer that four audio transducers 102, 103, 104, 105.

In one or more embodiments, the audio transducers 102, 103, 104, 105 are located about the sides of the electronic device 100. In one or more embodiments, the audio transducers 102, 103, 104, 105 can point to the side, top, or front of the device. Said differently, in one or more embodiments the audio transducers 102, 103, 104, 105 are located about a perimeter of the electronic device 100. In this illustrative embodiment, the audio transducers 102, 103, 104, 105 are each disposed at or near a corner of the electronic device 100. For example, a first audio transducer 102 can be disposed at a first corner of the electronic device 100, while another audio transducer 103 can be disposed at a second corner of the electronic device 100, and so forth.

It should be noted that corners are not the only location at which audio transducers 102, 103, 104, 105 can be located. There are many locations at audio transducers 102, 103, 104, 105 may be located. These locations include corner locations of the electronic device 100, edge locations of the electronic device 100, end locations of the electronic device 100, major face locations of the electronic device 100, or ad hoc locations of the electronic device 100 based upon application and desired functionality. These locations can be used individually or in combination to achieve the desired acoustic energy delivery or reception radius and radial detection sweep about the electronic device 100. For example, some audio transducers 102, 103, 104, 105 can be disposed along the front major face of the electronic device 100, while other audio transducers 102, 103, 104, 105 are disposed on the rear major face of the electronic device 100, and so forth. Other locations and combinations will be obvious to those of ordinary skill in the art having the benefit of this disclosure.

In addition to the audio transducers 102, 103, 104, 105, the electronic device 100 also includes one or more sensors. These sensors will be described in more detail with reference to FIGS. 2 and 3 below, but can include accelerometers, gravity detectors (note that an accelerometer can also serve as a gravity detector by measuring dynamic acceleration, motion/vibration, static acceleration, and so forth), motion detectors, temperature sensors, light sensors, touch sensors force sensors, location sensors, pressure sensors, and other sensors. One or more processors 106 of the electronic device 100 are operable with the audio transducers 102, 103, 104, 105 and the one or more sensors.

At step 107 of the method 101, a user 110 is using the electronic device 100 by holding it in the hand. The electronic device 100 therefore is not in an enclosed condition. It is instead in free-space, with only the user's hand touching the electronic device 100. In a non-enclosed condition, each of the audio transducers 102, 103, 104, 105 has associated therewith a transfer function 111, 112, 113, 114. In one or more embodiments, each transfer function 111, 112, 113, 114 establishes at least a predefined gain and predefined spectral equalization parameter for each of the audio transducers 102, 103, 104, 105. Thus, when operating in a non-enclosed environment, audio transducer 102 will operate using the gain and spectral equalization factors set forth in transfer function 111, while audio transducer 103 will operate using the gain and spectral equalization factors set forth in transfer function 112, and so forth.

While gain and spectral equalization factors are examples of parameters than can be included with each transfer function 111, 112, 113, 114, other factors can be used as well. For example, analog or digital filtering parameters, compression parameters, equalization parameters, noise reduction parameters, limiting parameters, leveling parameters, or other parameters can also be included in each transfer function 111, 112, 113, 114 as well. Some transfer functions will have one parameter, while others will have many. Other parameters suitable for inclusion with the transfer functions 111, 112, 113, 114 will be obvious to those of ordinary skill in the art having the benefit of this disclosure.

At step 108 of the method 101, the user 110 begins placing the electronic device 100 in a pocket. One or more sensors operable with the one or more processors 106 detect this transition from open air to an enclosed condition, i.e., an in-pocket condition in this example. For example, an accelerometer may detect, at step 108, the electronic device 100 being lowered from the user's head toward a pocket. Other techniques for detecting enclosed conditions will be described below with reference to FIG. 5. Still others will be obvious to those of ordinary skill in the art having the benefit of this disclosure.

At step 109 of the method 101, the one or more processors 106, operating with the one or more sensors, detect that the electronic device 100 is in an enclosed position or disposed within a repository container. In this illustrative example, the repository container enclosing the electronic device is the user's pocket 115. However, it should be noted that a pocket 115 is merely one type of repository container into which an electronic device 100 can be placed to create an enclosed condition. Purses, backpacks, cases, briefcases, attaches, drawers, and other repository containers can also create enclosed conditions for the electronic device 100.

In one or more embodiments, upon the one or more processors 106 or one or more sensors detecting the enclosed condition or that the electronic device 100 is disposed within a repository container, the one or more processors 106 determine an audio signal adjustment function 116 for the one or more audio transducers 102, 103, 104, 105. In one embodiment, the audio signal adjustment function 116 comprises at least a gain adjustment and a spectral equalization adjustment.

For example, after detecting the enclosed condition at step 109 of the method 101, the gain adjustment of the audio signal adjustment function 116 can increase the gain of one or more microphones or loudspeakers to be better able to better deliver to, or better receive from, acoustic energy from the environment through the enclosure, which in this case is the user's pocket 115. Gain adjustment works to acoustically overcome sound attenuation due to the pocket 115. Similarly, since it is difficult to completely assess the spectral impact on acoustic energy being received from, or delivered to, the environment through the pocket 115, the one or more processors 106 infer, from performing an audio sweep or other techniques, an audio degradation function. The audio signal adjustment function 116 can then include an inverse of this function to apply correction factors specific to the material of the pocket 115 that is impacting the audio "spectral function" of the one or more audio transducers 102, 103, 104, 105.

Where the free-space transfer function 111, 112, 113, 114 establishes a predefined gain and predefined spectral equalization parameter for each of the audio transducers 102, 103, 104, 105, the audio signal adjustment function 116 comprises at least a gain adjustment and a spectral equalization adjustment. However, where other factors are used in the transfer functions 111, 112, 113, 114, other adjustment parameters can be included in the audio signal adjustment function 116. For example, where the transfer function 111, 112, 113, 114 includes analog or digital filtering parameters, compression parameters, equalization parameters, noise reduction parameters, limiting parameters, leveling parameters, or other parameters, corresponding adjustments to one or more of these factors can also be included in the audio signal adjustment function 116.

At step 109, upon detecting the enclosed condition and determining the audio signal adjustment function 116 in response to the enclosed condition, the one or more processors 106 apply the audio signal adjustment function 116 to the one or more audio transducers 102, 103, 104, 105. Said differently, in one or more embodiments the one or more processors 106, upon the one or more sensors detecting the electronic device 100 is disposed within a repository container, i.e., pocket 115, apply the audio signal adjustment function 116 to signals 117, 118, 119, 120 received from the one or more microphones of the one or more audio transducers 102, 103, 104, 105 or delivered to one or more loudspeakers of the one or more audio transducers 102, 103, 104, 105, thereby mitigating noise or degradation in the signals 117, 118, 119, 120 caused by the repository container. In this illustrative example, the gain and spectral equalization of audio transducers 102, 103, 105 is adjusted in accordance with a determined function, while audio transducer 104 is simply turned OFF.

Figure 2:
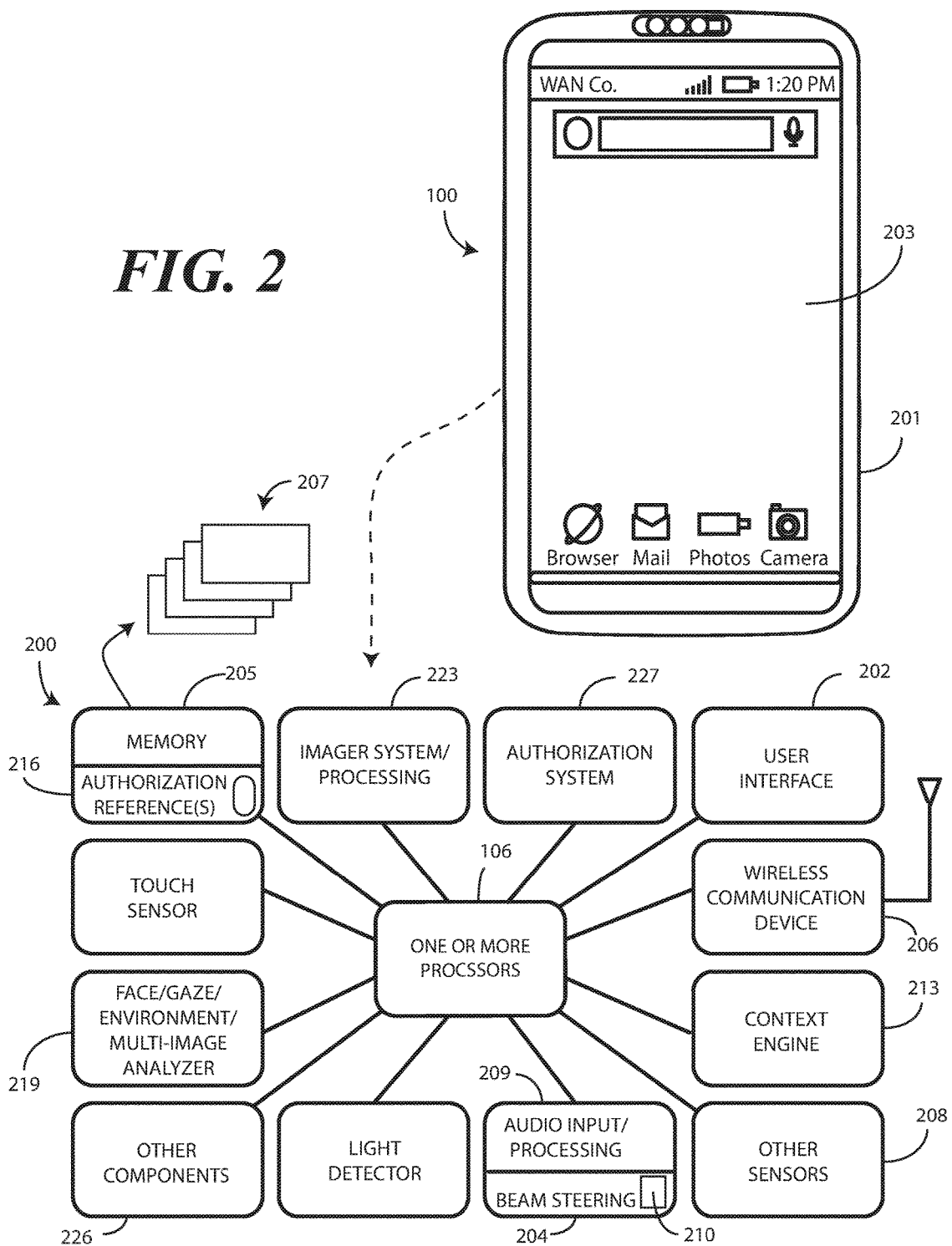
FIG. 2 illustrates one explanatory electronic device in accordance with one or more embodiments of the disclosure.

Turning now to FIG. 2, illustrated therein is one explanatory block diagram schematic 200 of the explanatory electronic device 100 of FIG. 1. In one or more embodiments, the block diagram schematic 200 is configured as a printed circuit board assembly disposed within a housing 201 of the electronic device 100. Various components can be electrically coupled together by conductors or a bus disposed along one or more printed circuit boards.

The illustrative block diagram schematic 200 of FIG. 2 includes many different components. Embodiments of the disclosure contemplate that the number and arrangement of such components can change depending on the particular application. Accordingly, electronic devices configured in accordance with embodiments of the disclosure can include some components that are not shown in FIG. 2, and other components that are shown may not be needed and can therefore be omitted.

The illustrative block diagram schematic 200 includes a user interface 202. In one or more embodiments, the user interface 202 includes a display 203, which may optionally be touch-sensitive. In one embodiment, users can deliver user input to the display 203 of such an embodiment by delivering touch input from a finger, stylus, or other objects disposed proximately with the display 203. In one embodiment, the display 203 is configured as an active matrix organic light emitting diode (AMOLED) display. However, it should be noted that other types of displays, including liquid crystal displays, suitable for use with the user interface 202 would be obvious to those of ordinary skill in the art having the benefit of this disclosure.

As noted above, in one or more embodiments the electronic device 100 includes one or more processors 106. In one embodiment, the one or more processors 106 can include an application processor and, optionally, one or more auxiliary processors. One or both of the application processor or the auxiliary processor(s) can include one or more processors. One or both of the application processor or the auxiliary processor(s) can be a microprocessor, a group of processing components, one or more ASICs, programmable logic, or other type of processing device. The application processor and the auxiliary processor(s) can be operable with the various components of the block diagram schematic 200. Each of the application processor and the auxiliary processor(s) can be configured to process and execute executable software code to perform the various functions of the electronic device with which the block diagram schematic 200 operates. A storage device, such as memory 205, can optionally store the executable software code used by the one or more processors 106 during operation.

In this illustrative embodiment, the block diagram schematic 200 also includes a communication circuit 206 that can be configured for wired or wireless communication with one or more other devices or networks. The networks can include a wide area network, a local area network, and/or personal area network. Examples of wide area networks include GSM, CDMA, W-CDMA, CDMA-2000, iDEN, TDMA, 2.5 Generation 3GPP GSM networks, 3rd Generation 3GPP WCDMA networks, 3GPP Long Term Evolution (LTE) networks, and 3GPP2 CDMA communication networks, UMTS networks, E-UTRA networks, GPRS networks, iDEN networks, and other networks. The communication circuit 206 may also utilize wireless technology for communication, such as, but are not limited to, peer-to-peer or ad hoc communications such as HomeRF, Bluetooth and IEEE 802.11 (a, b, g or n); and other forms of wireless communication such as infrared technology. The communication circuit 206 can include wireless communication circuitry, one of a receiver, a transmitter, or transceiver, and one or more antennas.

In one embodiment, the one or more processors 106 can be responsible for performing the primary functions of the electronic device with which the block diagram schematic 200 is operational. For example, in one embodiment the one or more processors 106 comprise one or more circuits operable with the user interface 202 to present presentation information to a user. The executable software code used by the one or more processors 106 can be configured as one or more modules 207 that are operable with the one or more processors 106. Such modules 207 can store instructions, control algorithms, and so forth.

In one or more embodiments, the block diagram schematic 200 includes an audio input/processor 209. The audio input/processor 209 is operable to receive audio input from an environment about the electronic device 100. The audio input/processor 209 can include hardware, executable code, and speech monitor executable code in one embodiment.

In one or more embodiments, the audio input/processor 209 is operable with the one or more audio transducers (102, 103, 104, 105) to perform an "acoustic sweep" when the electronic device 100 is in an enclosed condition. In one or more embodiments, the audio input/processor 209 performs an acoustic sweep by causing one or more loudspeakers of the one or more audio transducers (102, 103, 104, 105) to emit predefined acoustic signals. At the same time, the audio input/processor 209 causes one or more microphones of the one or more audio transducers (102, 103, 104, 105) to receive the predefined acoustic signals emitted by the one or more loudspeakers of the one or more audio transducers (102, 103, 104, 105).

The audio input/processor 209 can then measure attenuation or other transfer function degradation of those signals as received by one or more microphones of the one or more audio transducers (102, 103, 104, 105) of the electronic device 100. Accordingly, in one embodiment the acoustic sweep comprises delivering, from one or more audio output devices, a predefined acoustic output to one or more microphones and measuring, with one or more processors 106, attenuation of the predefined acoustic output occurring between the one or more audio output devices and the one or more microphones. The response coefficients can then be used to define the audio signal adjustment function (116).

Thus, in one or more embodiments the one or more audio transducers (102, 103, 104, 105) each comprise one or more audio output devices and one or more microphones. The one or more processors 106, working in conjunction with the audio input/processor 209, determine the audio signal adjustment function (116) function by measuring attenuation of a predefined acoustic output from the one or more audio output devices when received by the one or more microphones.

As noted above, these audio sweeps can be performed on a periodic basis. This helps to ensure that the audio signal adjustment function (116) is only applied when the electronic device 100 is in the enclosed condition. In one or more embodiments, when the enclosed condition ceases, application of the audio signal adjustment function (116) also ceases. Said differently, in one or more embodiments, the one or more processors 106 also detect, using one or more sensors 208, cessation of the enclosed condition. When this occurs, the one or more processors 106 terminate application of the audio signal adjustment function (116) to the signals (117, 118, 119, 120) received from the one or more audio transducers (102, 103, 104, 105).

In addition to being used to determine the audio signal adjustment function (116), the audio input/processor 209 can use the sweeps to determine in what type of repository container the electronic device 100 is situated as well. Using the example of a pocket (115) as a repository container, in one or more embodiments the audio input/processor 209 can be operable with one or more predefined authentication references 216 stored in memory 205. With reference to audio input, the predefined authentication references 216 can comprise representations of audio signals received during audio sweeps in predefined conditions.

For example, one predefined authentication reference 216 can comprise a representation of an audio sweep when the electronic device 100 is disposed in free space. Another predefined authentication reference 216 can comprise a representation of an audio sweep when the electronic device 100 is disposed within a denim pocket. Another authentication reference 216 can comprise a representation of an audio sweep when the electronic device 100 is disposed within a nylon pocket. Still another authentication reference 216 can comprise a representation of an audio sweep when the electronic device 100 is disposed within a corduroy pocket. By comparing the results of a performed audio sweep with the authentication references 216 stored in memory 205, the one or more processors 106 can estimate an identification of the material of the pocket (115).

Thus, in one or more embodiments the audio input/processor 209 can perform an acoustic sweep when the electronic device is detected as being disposed in an enclosure. A data representation of the sweep can then be compared to the one or more predefined authentication references 216 stored in a table in the memory 205. If a sufficiently matching predefined authentication reference 216 is found, the one or more processors 106 can conclude that the material associated with the sufficiently matching predefined authentication reference 216 is the material of the enclosure. If the sufficiently matching predefined authentication reference 216 corresponds to a denim pocket, for instance, the one or more processors 106 can conclude that the electronic device 100 is situated in a denim pocket, such as in a pocket of a pair of blue jeans.

Thus, in one or more embodiments where the enclosed condition comprises an in-pocket condition, the one or more processors 106 can identify a pocket material by referencing a table of predefined authentication references 216 or identification references corresponding to a plurality of pocket materials, each having a corresponding predefined audio signal adjustment function. By comparing the determined audio signal adjustment function (116) to the table of predefined authentication references 216 corresponding to a plurality of pocket materials, the one or more processors 106 can selecting a closest predefined audio signal adjustment function from the table to identify the material of the pocket (115). In one or more embodiments, when applying the audio signal adjustment function (116), the one or more processors 106 will apply the audio signal adjustment function (116) associated with the sufficiently matching predefined authentication reference 216, as it comprises the closest predefined audio signal adjustment function for the signals received from one or more microphones during the audio sweep. In general, the predefined authentication reference 216 and applying the audio signal adjustment function (116) will not be identical transfer functions, but rather transfer function pairs related to one another. This will allow the audio signal adjustment function (116) to correct for the degradation in a signal as it passes through a signal even though the degradation is not the same as what the acoustic wave experiences as it travels within the enclosed space.

Where no sufficiently matching predefined authentication reference 216 is found in the table in memory 205 such as resulting from multiple layers of clothing, the audio input/processor 209 or the one or more processors 106 can create a new predefined authentication reference 216. Illustrating by example, the one or more processors 106 may present a prompt on the display 203 asking the user (110) whether the electronic device 100 is situated within a pocket. If the user (110) indicates in the affirmative, the one or more processors 106 may place another prompt on the display 203 asking the identity of the material. If the user (110) were to enter "cotton taffeta," for instance, the audio input/processor 209 or the one or more processors 106 may create a new entry using the representation of the completed audio sweep as a predefined authentication reference 216 for future use in the memory. Accordingly, in one or more embodiments, upon failing to find a sufficiently matching predefined authentication reference 216 in the table in memory 205, the audio input/processor 209 or the one or more processors 106 may record the audio signal adjustment function from the audio sweep in the table as a new audio signal adjustment function or it may calculate the new signal adjustment function using other more direct methods detailed below.

The audio input/processor 209 can include a beam steering engine 204 comprising one or more microphones 220. Input from the one or more microphones 220 can be processed in the beam steering engine 204 such that the one or more microphones define a virtual microphone. This virtual microphone can define an acoustic reception cone that can be virtually "steered" around the electronic device 100. Alternatively, actual steering can occur as well, such as switching between a left and right microphone or a front and back microphone, or switching various microphones ON and OFF individually. In one or more embodiments, two or more microphones 220 can be included for selective beam steering by the beam steering engine 204.

Illustrating by example, a first microphone can be located on a first side of the electronic device 100 for receiving audio input from a first direction, while a second microphone can be placed on a second side of the electronic device 100 for receiving audio input from a second direction. These microphones can be "steered" by selectively turning them ON and OFF.

The beam steering engine 204 can then select between the first microphone and the second microphone to beam steer audio reception toward an object, such as a user delivering audio input. Illustrating by example, different microphones can be selected based upon their location along the electronic device 100 relative to acoustic energy generating source locations. The separation between microphones can be included as factors in beam steering, as well as the resulting phase shifts the incoming acoustic energy occurs as detected by microphones in different locations. In other words, since the microphones are disposed at different locations along the electronic device 100, each microphone responds respond differently to received acoustic energy based upon its separation and the location of the source of the acoustic energy. This beam steering can be responsive to input from other sensors, such as imagers, facial depth scanners, thermal sensors, or other sensors. For example, an imager can estimate a location of a person's face and deliver signals to the beam steering engine 204, thereby alerting it in which direction to focus the acoustic reception cone and/or steer the first microphone and the second microphone.

Alternatively, the beam steering engine 204 processes and combines the signals from two or more microphones to perform beam steering. The one or more microphones 220 can be used for voice commands. In response to control of the one or more microphones 220 by the beam steering engine 204, a user location direction can be determined. The beam steering engine 204 can then select between the first microphone and the second microphone to beam steer audio reception toward the user. Alternatively, the audio input/processor 209 can employ a weighted combination of the microphones to beam steer audio reception toward the user. In either of these embodiments, each microphone can be an omnidirectional microphone element or a directional microphone element.

Figure 3:
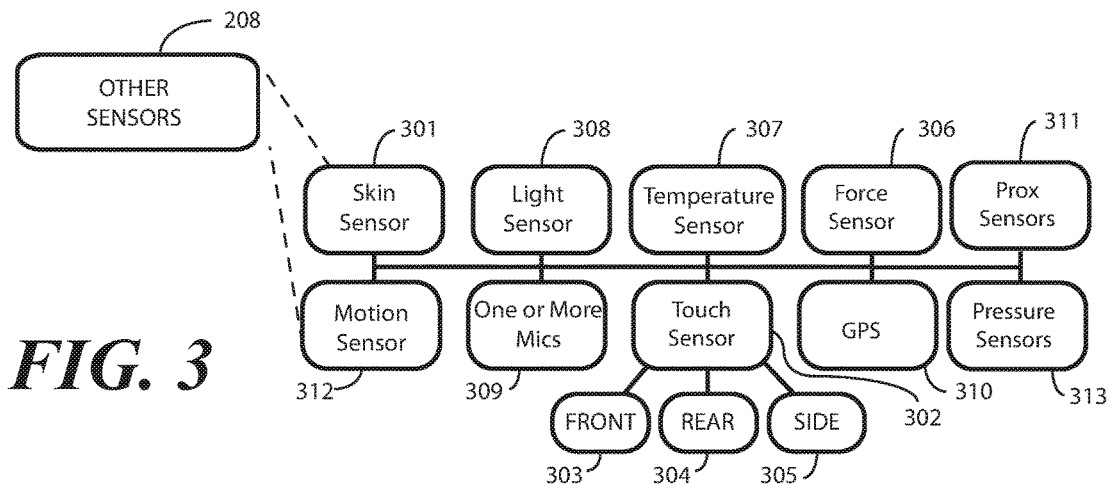
FIG. 3 illustrates one or more explanatory sensors in accordance with one or more embodiments of the disclosure.

Various sensors 208 can be operable with the one or more processors 106. Turning briefly to FIG. 3, illustrated therein are examples of some sensors that can be operable with the one or more processors (106) as well. In one or more embodiments, many of these other sensors 208 are environmental sensors to detect environmental conditions about the electronic device (100). General examples of these sensors include time sensors, date sensors, environmental sensors, weather sensors, ultrasonic sensors, location sensors, and so forth.

In one embodiment, a skin sensor 301 is configured to determine when the electronic device (100) is touching the skin of a person. For example, when the electronic device (100) is being held within the hand of a user, this can be detected by the skin sensor 301, which can be disposed along an edge of the electronic device (100) in one or more embodiments. The skin sensor 301 can include a substrate with an electrode disposed thereon. The electrode can confirm the object touching the skin sensor 301 is skin by detecting electrical signals generated by a heartbeat in one embodiment. Other forms of skin sensors will be obvious to those of ordinary skill in the art having the benefit of this disclosure.

A touch sensor 302 can be operable with, or in place of, the skin sensor 301. The touch sensor 302 can include a capacitive touch sensor, an infrared touch sensor, resistive touch sensors, or another touch-sensitive technology. In one or more embodiments, the touch sensor 302 comprises a plurality of touch sensors. For example, a first touch sensor 303 can be disposed on the front major face of the electronic device 100. A second touch sensor 304 can be disposed on the rear major face of the electronic device 100. A third touch sensor 305 can be situated along one or more of the minor faces defined by the sides of the electronic device 100. Capacitive touch-sensitive devices include a plurality of capacitive sensors, e.g., electrodes, which are disposed along a substrate. Each capacitive sensor is configured, in conjunction with associated control circuitry, e.g., the one or more processors (106), to detect an object in close proximity with—or touching—the surface of the display (203) or the housing (201) of the electronic device (100) by establishing electric field lines between pairs of capacitive sensors and then detecting perturbations of those field lines.

The electric field lines can be established in accordance with a periodic waveform, such as a square wave, sine wave, triangle wave, or other periodic waveform that is emitted by one sensor and detected by another. It should be noted that, generally speaking, there are two types of capacitive sensors: mutual capacitive sensors and self capacitive sensors. Mutual capacitive sensors employ a grid with source lines and sense lines. Objects touching the mutual capacitive sensors change the established charge between the source and sense lines of the grid. The self capacitive sensor is one where the object touching the sensor forms one side of the capacitor, while the other is a conductive plate in the electronic device (100). The capacitive sensors can be formed, for example, by disposing indium tin oxide patterned as electrodes on the substrate. Indium tin oxide is useful for such systems because it is transparent and conductive. Further, it is capable of being deposited in thin layers by way of a printing process. The capacitive sensors may also be deposited on the substrate by electron beam evaporation, physical vapor deposition, or other various sputter deposition techniques.

A force sensor 306 can be included. The force sensor 306 can take various forms. For example, in one embodiment, the force sensor 306 comprises resistive switches or a force switch array configured to detect contact with either the display (203) or the housing (201) of the electronic device (100). An "array" refers to a set of at least one switch. The array of resistive switches can function as a force-sensing layer, in that when contact is made with either the surface of the display (203) or the housing (201) or the touch sensors 302 of the electronic device (100), changes in impedance of any of the switches may be detected.

The array of switches may be any of resistance sensing switches, membrane switches, force-sensing switches such as piezoelectric switches, or other equivalent types of technology. In another embodiment, the force sensor 306 can be capacitive. In yet another embodiment, piezoelectric sensors can be configured to sense force as well. For example, where coupled with the lens of the display (203), the piezoelectric sensors can be configured to detect an amount of displacement of the lens to determine force. The piezoelectric sensors can also be configured to determine force of contact against the housing (201) of the electronic device (100) rather than the display (203).

A temperature sensor 307 can be configured to monitor the temperature of the environment. A light sensor 308 can be used to detect whether or not ambient light is incident on the housing (201) of the electronic device (100). The light sensor 308 can also be used to detect an intensity of ambient light is above or below a predefined threshold. It should be noted that either an infrared sensor, e.g., the one or more proximity sensors 311 described below, or the light sensor 308 can be used to detect daylight and/or sun light. This information can be used to distinguish between a non-enclosed condition and an enclosed condition, such as when the electronic device (100) is situated within a dark pocket or purse. In one or more embodiments the light sensor 308 can detect changes in optical intensity, color, light, or shadow in the near vicinity of the electronic device (100).

This information can be used to make inferences about whether the electronic device (100) is disposed within a repository container, such as a pocket (115). For example, if the light sensor 308 detects low-light conditions, i.e., when the intensity of received ambient light is below a predefined threshold, this can indicate that the electronic device (100) is disposed within a repository container. In one embodiment, the light sensor 308 can be configured as an image-sensing device that captures successive images about the device and compares luminous intensity, color, or other spatial variations between images to detect weather conditions. The pressure sensor 313 can distinguish an enclosed condition, e.g., inside a pocket from a non-enclosed, e.g., outside the pocket, condition.

One or more microphones 309, which may be part of the one or more transducers (102, 103, 104, 105) or may be in addition to the one or more transducers (102, 103, 104, 105), can be included to receive acoustic input. While the one or more microphones 309 can be used to sense voice input, voice commands, and other audio input, in one or more embodiments they can be used as environmental sensors to sense environmental sounds such as rumpling of soft surfaces of repository containers encapsulating the electronic device (100), such as textile materials, leather, vinyl, nylon, or synthetic materials. Alternatively, the one or more microphones 309 can be used to detect the nearby presence of items stowed in a repository container, such as the coins, keys, lotions, lip balm, and other items that may be disposed within a pocket (115) or purse with the electronic device (100). Accordingly, an enclosed condition can be inferred from acoustic data captured by the one or more microphones in one or more embodiments.

In one or more embodiments, the one or more processors (106) may require location information of the electronic device (100), such as to know whether the electronic device (100) is in a car. Accordingly, in one embodiment a global positioning system device 310 can be included for determining a location and/or movement of the electronic device (100). In one or more embodiments, the global positioning system device 310 is configured for communicating with a constellation of earth orbiting satellites or a network of terrestrial base stations to determine an approximate location. Examples of satellite positioning systems suitable for use with embodiments of the present invention include, among others, the Navigation System with Time and Range (NAV STAR) Global Positioning Systems (GPS) in the United States of America, the Global Orbiting Navigation System (GLONASS) in Russia, and other similar satellite positioning systems. The satellite positioning systems based location fixes of the global positioning system device 310 autonomously or with assistance from terrestrial base stations, for example those associated with a cellular communication network or other ground based network, or as part of a Differential Global Positioning System (DGPS), as is well known by those having ordinary skill in the art.

While a global positioning system device 310 is one example of a location determination device, it will be clear to those of ordinary skill in the art having the benefit of this disclosure that other location determination devices, such as electronic compasses or gyroscopes, could be used as well. For example, the global positioning system device 310 can be replaced by, or accompanied by, a location detector able to determine location by locating or triangulating terrestrial base stations of a traditional cellular network, such as a CDMA network or GSM network, or from other local area networks, such as Wi-Fi networks.

A proximity detector component 311 can emit infrared signals to determine when the electronic device (100) is covered by an object such as the sides of a repository container or the items disposed therein. Other sensors, subsets of these sensors, and so forth can be used in accordance with the methods described herein.

The other sensors 208 can also include a motion sensor 312. The motion sensor 312 can include motion detectors, such as one or more accelerometers or gyroscopes. For example, an accelerometer may be embedded in the electronic circuitry of the electronic device (100) to show vertical orientation, constant tilt and/or whether the electronic device (100) is stationary. The measurement of tilt relative to gravity is referred to as "static acceleration," while the measurement of motion and/or vibration is referred to as "dynamic acceleration." A gyroscope can be used in a similar fashion.

Regardless of the type of motion sensors 312 that are used, in one embodiment the motion sensors 312 are also operable to detect movement, and direction of movement, of the electronic device (100) by a user. In one or more embodiments, the other sensors 208 and the motion sensors 312 can each be used to detect motion corresponding to a user's body or to human motion. This information can be used to determine that the electronic device (100) is proximately located with a user's body, which can lead to a conclusion that the electronic device (100) is disposed within a pocket (115).

Illustrating by example, in one embodiment when the electronic device (100) is placed within a pocket (115) of clothing that a user (110) is wearing, the motion sensors 312 can be used to detect predefined motions corresponding to human motion. These predefined motions can be small, and can include vibration, shaking, breathing, micromotions, and so forth. For instance, if the user is walking, the motion sensors 312 can detect this movement. The one or more processors (106) can then extract parametric data from electronic signals delivered by these motion sensors 312 in response to the user walking. By comparing the parametric data to a reference file stored in memory (205), the one or more processors (106) can identify the walking motion as corresponding to the motion of the user's body. The one or more processors (106) can use this information to distinguish the electronic device (100) being in a user's pocket (115) compared to, for example, being in a drawer.

Similarly, if the user is simply sitting in a chair, the motion sensors 312 can be used to detect body motions—even tiny ones—such as that of the user breathing. By comparing the parametric data extracted from this motion to a reference file stored in memory (205), the one or more processors (106) can identify the fact that the movement that the electronic device (100) is experiencing is due to the fact that the electronic device (100) is proximately located with a user's torso, limbs, head, or appendages, or otherwise generally disposed along the user body instead of, for example, being placed on a table. Other user motion that can be readily detected by parametric data includes motion associated with driving, riding a bike, or simply shifting in their seat. In one or more embodiments, the one or more processors (106) can conclude from these motions that the electronic device (100) is disposed near or on a person's body.

These other sensors 208 can be used to confirm the electronic device (100) is disposed within a repository container in one or more embodiments. Said differently, when the one or more processors (106) determine that an intensity of received ambient light is below a predefined threshold, an absence of touch sensor actuation occurs along a housing of the electronic device (100), and an approximately common temperature occurring at both a first location of the electronic device and a second location of the electronic device (100), the one or more processors (106) conclude that the electronic device (100) is disposed within a repository container such as a pocket (115) or purse.

The one or more of these other sensors 208 can be used to confirm this conclusion in one or more embodiments. For example, the motion sensor 312 may confirm that motion of the electronic device (100) defined by parametric data from the motion sensor 312 indicates an approximate rotational stability of the electronic device 1300), thereby confirming that the electronic device (100) is covered by one or more sides of the repository container. The microphone 309 may detect the sound of textile material, leather, or synthetic materials as the electronic device (100) slides into the repository container. The skin sensor 301 may detect that no skin is touching the housing (201). The proximity detector component 311 may determine that the electronic device (100) is covered. The temperature sensor 307 can be used to determine that the approximately static temperature occurring at the first location and the second location of the electronic device (100) remains during a predetermined temperature measurement interval, such as thirty seconds or a minute. These each can provide a confirmation of the in-repository container condition, and can be used alone or in combination with other factors.

The motion sensors 312 can be configured as an orientation detector that determines an orientation and/or movement of the electronic device (100) in three-dimensional space. The orientation detector can determine the spatial orientation of an electronic device (100) in three-dimensional space by, for example, detecting a gravitational direction. In addition to, or instead of, an accelerometer, an electronic compass can be included to detect the spatial orientation of the electronic device (100) relative to the earth's magnetic field. Similarly, one or more gyroscopes can be included to detect rotational orientation of the electronic device (100).

One or more pressure sensors 313 can be included to detect pressure applied to the electronic device (100). The one or more pressure sensors 313 can be coupled to analog-to-digital converters to provide the one or more processors (106) digitized version of a pressure signal received from the one or more pressure sensors 313.

Turning now back to FIG. 2, in one or more embodiments an authentication system 227 is operable with the one or more processors 106. A first authenticator of the authentication system 227 can include an imager processing system 223. The imager processing system 223 can include one or more of an imager, a depth imager, thermal sensor, or combinations thereof. In one embodiment, the imager comprises a two-dimensional imager configured to receive at least one image of a person within an environment of the electronic device 100. In one embodiment, the imager comprises a two-dimensional Red-Green-Blue (RGB) imager. In another embodiment, the imager comprises an infrared imager. Other types of imagers suitable for use with the imager processing system 223 and the authentication system 227 will be obvious to those of ordinary skill in the art having the benefit of this disclosure.

Where included, the thermal sensor of the imager processing system 223 can also take various forms. In one embodiment, the thermal sensor is simply a proximity sensor component, also referred to as "presence sensor," which detects temperature change. In another embodiment, the thermal sensor comprises a simple thermopile. In another embodiment, the thermal sensor comprises an infrared imager that captures the amount of thermal energy emitted by an object. Other types of thermal sensors will be obvious to those of ordinary skill in the art having the benefit of this disclosure.

Where included, the depth imager can take a variety of forms. In a first embodiment, the depth imager comprises a pair of imagers separated by a predetermined distance, such as three to four images. This "stereo" imager works in the same way the human eyes do in that it captures images from two different angles and reconciles the two to determine distance.

In another embodiment, the depth imager employs a structured light laser. The structured light laser projects tiny light patterns that expand with distance. These patterns land on a surface, such as a user's face, and are then captured by an imager. By determining the location and spacing between the elements of the pattern, three-dimensional mapping can be obtained.

In still another embodiment, the depth imager comprises a time of flight device. Time of flight three-dimensional sensors emit laser or infrared pulses from a photodiode array. These pulses reflect back from a surface, such as the user's face. The time it takes for pulses to move from the photodiode array to the surface and back determines distance, from which a three-dimensional mapping of a surface can be obtained. Regardless of embodiment, the depth imager adds a third "z-dimension" to the x-dimension and y-dimension defining the two-dimensional image captured by the imager, thereby enhancing the security of using a person's face as their password in the process of authentication by facial recognition.

The authentication system 227 can be operable with a face/environmental analyzer 219. The face/environmental analyzer 219 can be configured to process an image or depth scan of an object and determine whether the object matches predetermined criteria by comparing the image or depth scan to one or more predefined authentication references stored in memory 205.

For example, the face/environmental analyzer 219 can operate as an authentication module configured with optical and/or spatial recognition to identify objects using image recognition, character recognition, visual recognition, facial recognition, color recognition, shape recognition, and the like. Advantageously, face/environmental analyzer 219, operating in tandem with the authentication system 227, can be used as a facial recognition device to determine the identity of one or more persons detected about the electronic device 100.

In one embodiment when the authentication system 227 detects a person, one or both of the imager and/or the depth imager can capture a photograph and/or depth scan of that person. The authentication system 227 can then compare the image and/or depth scan to one or more predefined authentication references stored in the memory 205. This comparison, in one or more embodiments, is used to confirm beyond a threshold authenticity probability that the person's face—both in the image and the depth scan—sufficiently matches one or more of the predefined authentication references stored in the memory 205 to authenticate a person as an authorized user of the electronic device 100.

The face/environmental analyzer 219 can include a gaze detector. The gaze detector can comprise sensors for detecting the user's gaze point. The gaze detector can optionally include sensors for detecting the alignment of a user's head in three-dimensional space. Electronic signals can then be processed for computing the direction of user's gaze in three-dimensional space. The gaze detector can further be configured to detect a gaze cone corresponding to the detected gaze direction, which is a field of view within which the user may easily see without diverting their eyes or head from the detected gaze direction. The gaze detector can be configured to alternately estimate gaze direction by inputting images representing a photograph of a selected area near or around the eyes. It will be clear to those of ordinary skill in the art having the benefit of this disclosure that these techniques are explanatory only, as other modes of detecting gaze direction can be substituted in the gaze detector of FIG. 2.

The face/environmental analyzer 219 can include its own image/gaze detection-processing engine as well. The image/gaze detection-processing engine can process information to detect a user's gaze point. The image/gaze detection-processing engine can optionally also work with the depth scans to detect an alignment of a user's head in three-dimensional space. Electronic signals can then be delivered from the imager or the depth imager for computing the direction of user's gaze in three-dimensional space. The image/gaze detection-processing engine can further be configured to detect a gaze cone corresponding to the detected gaze direction, which is a field of view within which the user may easily see without diverting their eyes or head from the detected gaze direction. The image/gaze detection-processing engine can be configured to alternately estimate gaze direction by inputting images representing a photograph of a selected area near or around the eyes. It can also be valuable to determine if the user wants to be authenticated by looking directly at device. The image/gaze detection-processing engine can determine not only a gazing cone but also if an eye is looking in a particular direction to confirm user intent to be authenticated.

Other components 226 operable with the one or more processors 106 can include output components such as video, audio, and/or mechanical outputs. For example, the output components may include a video output component or auxiliary devices including a cathode ray tube, liquid crystal display, plasma display, incandescent light, fluorescent light, front or rear projection display, and light emitting diode indicator. Other examples of output components include audio output components such as a loudspeaker disposed behind a speaker port or other alarms and/or buzzers and/or a mechanical output component such as vibrating or motion-based mechanisms.

The other components 226 can also include proximity sensors. The proximity sensors fall in to one of two camps: active proximity sensors and "passive" proximity sensors. Either the proximity detector components or the proximity sensor components can be generally used for gesture control and other user interface protocols, some examples of which will be described in more detail below.

As used herein, a "proximity sensor component" comprises a signal receiver only that does not include a corresponding transmitter to emit signals for reflection off an object to the signal receiver. A signal receiver only can be used due to the fact that a user's body or other heat generating object external to device, such as a wearable electronic device worn by user, serves as the transmitter. An active proximity sensor, which includes a transmitter and a receiver, measures reflection of transmitted signals as received by a receiver. Passive proximity sensors include only a receiver that receives transmitted signals from outside the electronic device 100, e.g., body heat, etc. Illustrating by example, in one the proximity sensor components comprise a signal receiver to receive signals from objects external to the housing 201 of the electronic device 100. In one embodiment, the signal receiver is an infrared signal receiver to receive an infrared emission from an object such as a human being when the human is proximately located with the electronic device 100. In one or more embodiments, the proximity sensor component is configured to receive infrared wavelengths of about four to about ten micrometers. This wavelength range is advantageous in one or more embodiments in that it corresponds to the wavelength of heat emitted by the body of a human being.

Additionally, detection of wavelengths in this range is possible from farther distances than, for example, would be the detection of reflected signals from the transmitter of a proximity detector component. In one embodiment, the proximity sensor components have a relatively long detection range so as to detect heat emanating from a person's body when that person is within a predefined thermal reception radius. For example, the proximity sensor component may be able to detect a person's body heat from a distance of about fifteen feet in one or more embodiments. The ten-foot dimension can be extended as a function of designed optics, sensor active area, gain, lensing gain, and so forth.

Proximity sensor components are sometimes referred to as a "passive IR detectors" due to the fact that the person is the active transmitter. Accordingly, the proximity sensor component requires no transmitter since objects disposed external to the housing deliver emissions that are received by the infrared receiver. As no transmitter is required, each proximity sensor component can operate at a very low power level. Simulations show that a group of infrared signal receivers can operate with a total current drain of just a few microamps.

In one embodiment, the signal receiver of each proximity sensor component can operate at various sensitivity levels so as to cause the at least one proximity sensor component to be operable to receive the infrared emissions from different distances. For example, the one or more processors 106 can cause each proximity sensor component to operate at a first "effective" sensitivity so as to receive infrared emissions from a first distance. Similarly, the one or more processors 106 can cause each proximity sensor component to operate at a second sensitivity, which is less than the first sensitivity, so as to receive infrared emissions from a second distance, which is less than the first distance. The sensitivity change can be effected by causing the one or more processors 106 to interpret readings from the proximity sensor component differently.

By contrast, proximity detector components include a signal emitter and a corresponding signal receiver, which constitute an "active IR" pair. While each proximity detector component can be any one of various types of proximity sensors, such as but not limited to, capacitive, magnetic, inductive, optical/photoelectric, imager, laser, acoustic/sonic, radar-based, Doppler-based, thermal, and radiation-based proximity sensors, in one or more embodiments the proximity detector components comprise infrared transmitters and receivers. The infrared transmitters are configured, in one embodiment, to transmit infrared signals having wavelengths of about 860 nanometers, which is one to two orders of magnitude shorter than the wavelengths received by the proximity sensor components. The proximity detector components can have signal receivers that receive similar wavelengths, i.e., about 860 nanometers.

In one or more embodiments, each proximity detector component can be an infrared proximity sensor set that uses a signal emitter that transmits a beam of infrared light that reflects from a nearby object and is received by a corresponding signal receiver. Proximity detector components can be used, for example, to compute the distance to any nearby object from characteristics associated with the reflected signals. The reflected signals are detected by the corresponding signal receiver, which may be an infrared photodiode used to detect reflected light emitting diode (LED) light, respond to modulated infrared signals, and/or perform triangulation of received infrared signals.

The other components 226 can optionally include a barometer operable to sense changes in air pressure due to elevation changes or differing pressures of the electronic device 100. Where included, in one embodiment the barometer includes a cantilevered mechanism made from a piezoelectric material and disposed within a chamber. The cantilevered mechanism functions as a pressure sensitive valve, bending as the pressure differential between the chamber and the environment changes. Deflection of the cantilever ceases when the pressure differential between the chamber and the environment is zero. As the cantilevered material is piezoelectric, deflection of the material can be measured with an electrical current.

The other components 226 can also optionally include a light sensor that detects changes in optical intensity, color, light, or shadow in the environment of an electronic device. This can be used to make inferences about context such as weather or colors, walls, fields, and so forth, or other cues. An infrared sensor can be used in conjunction with, or in place of, the light sensor. The infrared sensor can be configured to detect thermal emissions from an environment about the electronic device 100. Similarly, a temperature sensor can be configured to monitor temperature about an electronic device.

A context engine 213 can then operate with the various sensors to detect, infer, capture, and otherwise determine persons and actions that are occurring in an environment about the electronic device 100. For example, where included one embodiment of the context engine 213 determines assessed contexts and frameworks using adjustable algorithms of context assessment employing information, data, and events. These assessments may be learned through repetitive data analysis. Alternatively, a user may employ the user interface 202 to enter various parameters, constructs, rules, and/or paradigms that instruct or otherwise guide the context engine 213 in detecting multi-modal social cues, emotional states, moods, and other contextual information. The context engine 213 can comprise an artificial neural network or other similar technology in one or more embodiments.

In one or more embodiments, the context engine 213 is operable with the one or more processors 106. In some embodiments, the one or more processors 106 can control the context engine 213. In other embodiments, the context engine 213 can operate independently, delivering information gleaned from detecting multi-modal social cues, emotional states, moods, and other contextual information to the one or more processors 106. The context engine 213 can receive data from the various sensors. In one or more embodiments, the one or more processors 106 are configured to perform the operations of the context engine 213.

In one or more embodiments, the one or more processors 106 can be operable with the various authenticators of the authentication system 227. For example, the one or more processors 106 can be operable with a first authenticator and a second authenticator. Where more authenticators are included in the authentication system 227, the one or more processors 106 can be operable with these authenticators as well.

It is to be understood that FIG. 2 is provided for illustrative purposes only and for illustrating components of one electronic device 100 in accordance with embodiments of the disclosure, and is not intended to be a complete schematic diagram of the various components required for an electronic device. Therefore, other electronic devices in accordance with embodiments of the disclosure may include various other components not shown in FIG. 2, or may include a combination of two or more components or a division of a particular component into two or more separate components, and still be within the scope of the present disclosure.

Figure 4:
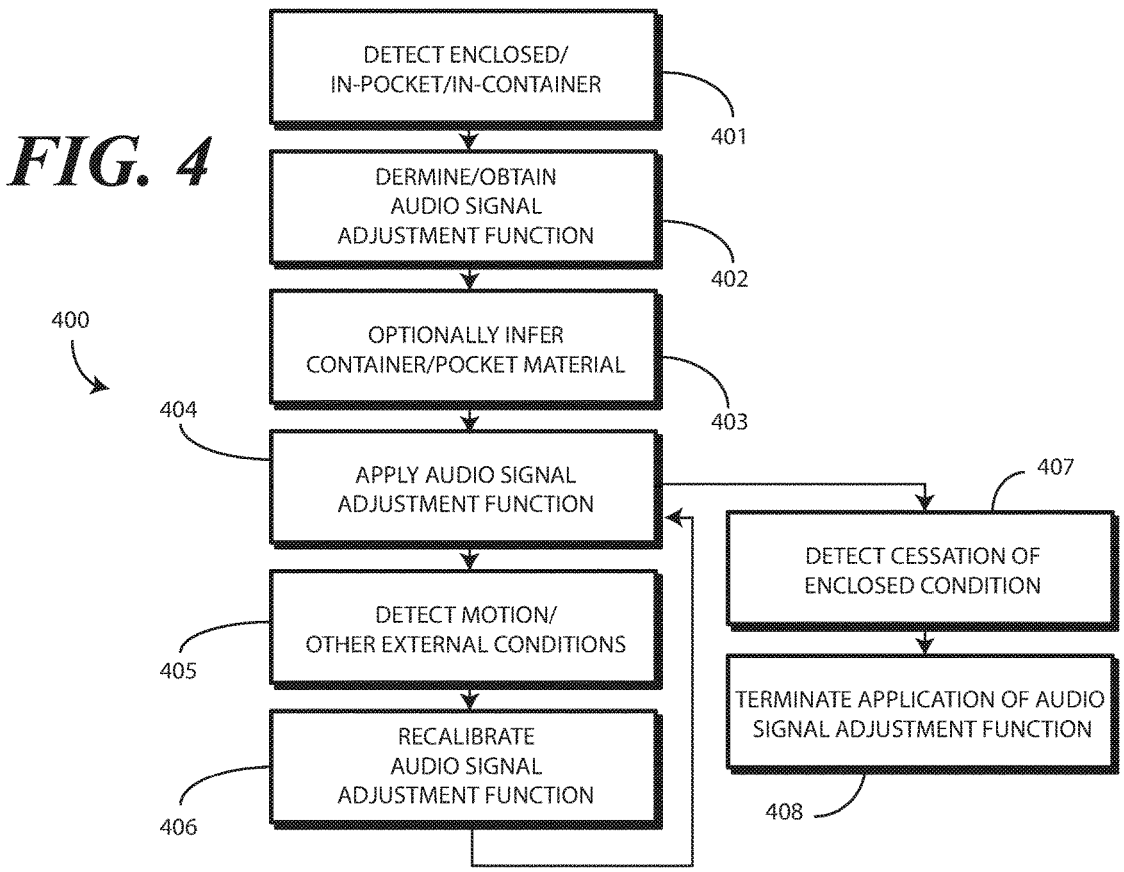
FIG. 4 illustrates one or more explanatory method steps in accordance with one or more embodiments of the disclosure.
Figure 5:
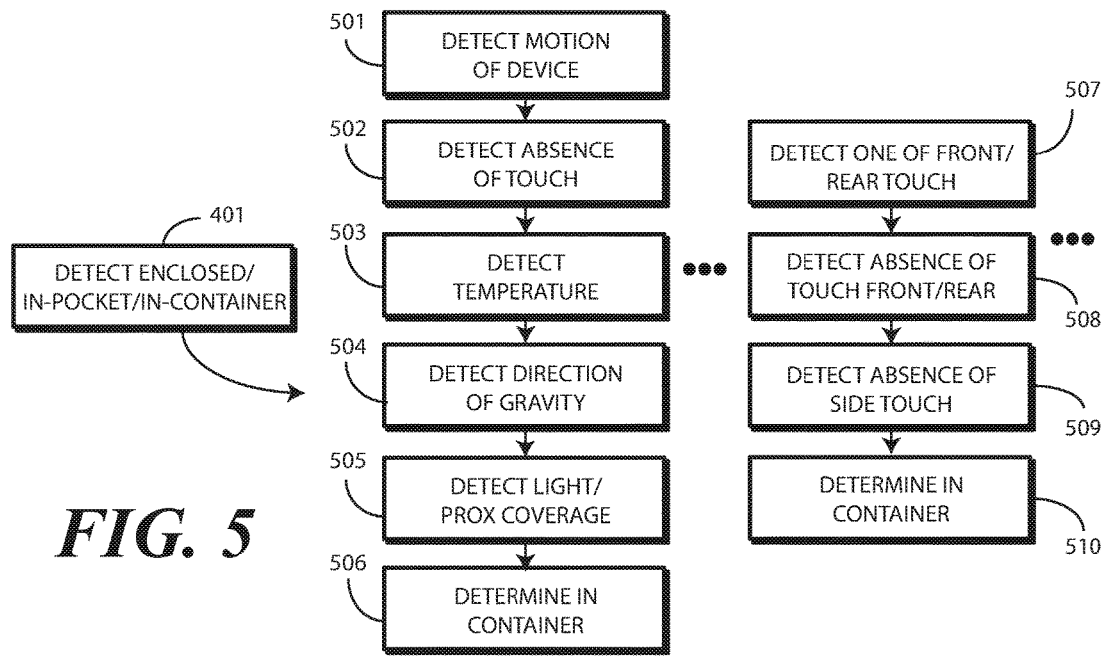
FIG. 5 illustrates one explanatory method in accordance with one or more embodiments of the disclosure.

Turning now to FIG. 4, illustrated therein is one explanatory method 400 in accordance with one or more embodiments of the disclosure. At step 401, the method 400 detects, using one or more sensors, that an electronic device is in an enclosed condition, which can occur as a result of the electronic device being placed in a pocket, purse, or other repository container. This step 401 can occur in a number of ways. Turning briefly to FIG. 5, illustrated therein are two methods by which the detection of the enclosed condition can occur.

Illustrated in FIG. 5 are two methods for performing the step 401 of detecting, with one or more sensors of the electronic device, an enclosed condition, such as when the electronic device is placed in a pocket or purse. Beginning with step 501 of the first method, in one embodiment one or more processors of the electronic device detect motion, which can be continuous motion or, even if the user is not moving, micromotion, of the electronic device. The one or more processors then extract parametric data from signals corresponding to the motion as delivered by the motion detector. The one or more processors can then compare the motion to human motion to confirm that the electronic device is disposed along a human body. When the electronic device is situated in the pocket, the one or more processors will detect human motion data.

At step 502, the one or more processors can then detect an absence of finger touch along a housing of the electronic device. When the electronic device is disposed within the pocket, the one or more processors will accordingly detect that the user is not touching the electronic device.

At step 503, the one or more processors can detect the temperature of the electronic device using the temperature sensor or alternatively the proximity sensor components. This temperature detection can be done for the electronic device overall, at selective locations or at a first end and at a second end. In one embodiment, the one or more processors can determine if any or all of the electronic device temperature, the temperature of the first end of the electronic device, or the temperature at the second end of the electronic device exceeds a predetermined threshold, such as eighty degrees Fahrenheit. In another embodiment, the one or more processors can determine if the temperature of the first location of the electronic device and/or the temperature at the second location of the electronic device exceeds a predetermined threshold, such as eighty degrees Fahrenheit. Where it does not, the electronic device may be stored in another vessel such as a drawer. Where it is, this optional decision can confirm that the electronic device is actually disposed within the pocket. Moreover, this information can be used to determine which side of the electronic device is facing toward the user due to which capacitive sensor is facing the body—front or back. In one or more embodiments, an accelerometer can also distinguish sliding motion as the electronic device is being inserted into pocket and micromotion of the user's body.

In one or more embodiments, the one or more processors can detect a temperature of the electronic device at both the first location and at the second location. The one or more processors can determine whether these temperatures define an approximately common temperature. As noted above, in one embodiment the approximately common temperature is defined by a temperature difference that is within a predefined range. In one illustrative embodiment, the temperature difference is plus or minus two degrees centigrade. Other ranges will be obvious to those of ordinary skill in the art having the benefit of this disclosure. Where the temperature is an approximately common temperature, this can indicate that there is no significant differential as would be the case if the user was holding either the first end or the second end in their hand with the other end in the air. This is indicative of the electronic device being disposed within the pocket.

In one or more embodiments, after executing steps 501, 502, 503, the one or more processors can confirm that the electronic device is disposed within the pocket when the motion corresponds to human movement, the absence of finger touch is confirmed, and the temperature at the first location and the second location is within a predefined range. Accordingly, when an electronic device is placed within a pocket, embodiments of the disclosure confirm no side touching is occurring with a touch sensor and confirm that motion corresponds to human movement, and when both conditions are true, then confirm with either a temperature sensor or one or more proximity sensor components that a warm body is adjacent to the electronic device. Where proximity sensor components are used, it can be preferable to use the sensors disposed at the bottom of the electronic device. These can be selected based upon a determination of a gravity direction as explained below. If both bottom proximity sensor components indicate similar thermal levels, then electronic device is determined to be in a pocket.

There are additional, optional steps that can be performed ensure that the conclusion that the electronic device is disposed within the pocket has a lower margin of error. Beginning with optional step 504, in one or more embodiments the one or more processors are further operable to determine a gravity direction relative to the electronic device.

This can be done with the accelerometer in one embodiment. In one or more embodiments, the one or more processors are further operable to determine an orientation of the electronic device once the electronic device has been placed within the pocket. Accordingly, in one or more embodiments the one or more processors confirm that at least a component of the gravity direction runs from a first end of the electronic device to a second end of the electronic device to confirm the in-pocket status, as the electronic device will generally be right side up or upside down when in a front or rear pants pocket. In one embodiment, once the "most downward" pointing end is determined, the first location and the second location can be determined as a function of this end. For example, in one embodiment, both the first location and the second location are disposed at a common end, which is the most downward pointing end, or the second end in this example. This ensures that both the first location and the second location are disposed within the pocket.

Where a user places the electronic device in a pocket, as was shown above at step (108) of FIG. 1, the movement used to place the electronic device in the pocket has associated therewith a velocity and acceleration. In one embodiment the one or more processors can determine, with the motion detector whether the movement and/or motion profile, which can include velocity and acceleration, duration, and the stopping of the motion occurring during the movement exceeds a predetermined threshold. In one embodiment, a predetermined acceleration threshold is about 0.5 meters per second square, net of gravity. Embodiments of the disclosure contemplate that the user will take care to ensure that the electronic device is safely placed within the pocket. Accordingly, the movement will be slow and deliberate. Additionally, when a person is walking, the motion of the electronic device will be slow as well. If a person is simply sitting in a chair and breathing, the velocity and acceleration experienced by the electronic device will be low as well. By confirming that characteristics of the movement, such as velocity and acceleration are below a predefined threshold, this can serve as an additional confirmation of the in-pocket condition.

In one or more embodiments, the acceleration determination can be used in other ways as well. First, it can be used to confirm that the movement moving the electronic device occurred with the gravity direction, i.e., downward, as would be the case when placing the electronic device in a pocket, but not when raising the electronic device to the user's ear. Second, by comparing the acceleration to a predetermined threshold, the acceleration can be used to confirm that a user is actually placing the electronic device in a pocket rather than performing some other operation, such as waving the electronic device around. Other uses for the acceleration data will be obvious to those of ordinary skill in the art having the benefit of this disclosure.

The one or more processors can compare the movement to the gravity direction. For example, in one embodiment the one or more processors can determine whether at least some of the movement was against the gravity direction. Similarly, in one embodiment the one or more processors can determine whether a component of the gravity direction runs from a first end of the electronic device to a second end of the electronic device.

At optional step 505, the one or more processors can further confirm that the electronic device is in the pocket by determining whether an object, such as clothing, textile materials, or other natural, synthetic, or blend layer is covering the electronic device. This determination can be made when the one or more processors receive signals from the one or more proximity detector components indicating that an object, such as textile material, is less than a predefined distance from a surface of the electronic device, thereby indicating that the electronic device is covered by the object. Where this occurs, the one or more processors can further confirm that the electronic device is disposed within the pocket. This detection of an object covering the electronic device can also serve as a confirmation that the electronic device is not being touched as well.

Optional step 505 can additionally include determining, with a light sensor, whether ambient or direct light is incident on the housing of the electronic device. Of course, when the electronic device is covered by the pocket, ambient or direct light is generally not incident on the housing. Sometimes, some of the housing is exposed from the pocket. However, in most situations the vast majority of the housing is situated within the pocket. Modern light sensors are more than capable of determining that the majority of the housing is covered. Accordingly, in one or more embodiments the determination that the electronic device is disposed within the pocket can further include determining, with a light sensor, that ambient or direct light is not incident on the housing. Again, that is the electronic device is determined to be in the pocket instead of on another surface when tilts and small motions are detected via the accelerometer combined with the electronic device not being touched as determined by edge touch sensors.

The factors listed above can be used in the function of determining whether the electronic device is disposed within a pocket, at step 506, alone or in combination. For example, the function can consider one, two, three, or all of the factors. Considering more factors assists in preventing false detection of the in-pocket condition. Embodiments of the disclosure contemplate that a user should be minimally affected due to false detection. Accordingly, in one embodiment the one or more processors consider all factors. However, subsets of the factors can be useful in many applications.

The second method of FIG. 5 is simpler. In one or more embodiments, the electronic device includes at least three touch sensors. A first touch sensor can be disposed on the front major face of the electronic device. A second touch sensor can be disposed on the rear major face of the electronic device. A third touch sensor can be situated along one or more of the minor faces defined by the sides of the electronic device.

At step 507, the second method detects touch of a human body on either the front major face or the rear major face of the electronic device. For example, when the electronic device is stowed within a pocket, a touch sensor abutting the user's leg can detect the touch of a person from a combination of the contact and temperature of the person.

At step 508, the second method detects an absence of touch on the other of the front major face or the rear major face. For example, when the electronic device is stowed within a pocket, a touch sensor facing away from the person will detect an absence of the touch of a person from a combination of contact and temperature.

At step 509, the second method detects an absence of touch on the minor faces defined by the sides of the electronic device. Where there is touch detected on one major face, and an absence of touch detected on the other major face and the minor faces defined by the sides of the electronic device, in one or more embodiments the second method concludes that the device is stowed within a pocket at step 510.

While two methods of detecting an electronic device is in a repository container, such as a pocket, have been shown in FIG. 5, it should be noted that embodiments of the disclosure are not so limited. Other methods of detecting an electronic device is in a repository container, such as a pocket will be obvious to those of ordinary skill in the art having the benefit of this disclosure, and can be substituted for the methods described with reference to FIG. 5.

Figure 6:
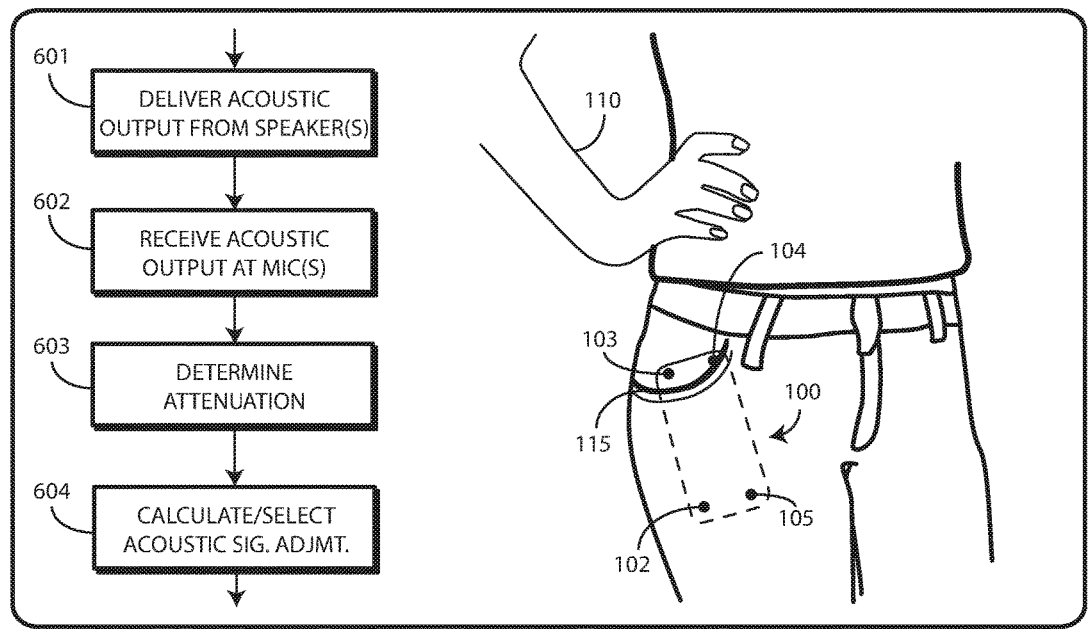
FIG. 6 illustrates one or more method steps in accordance with one or more embodiments of the disclosure.

Turning now back to FIG. 4, at step 402 the method 400 determines, with one or more processors, an audio signal adjustment function for one or more audio transducers of the electronic device in response to the enclosed condition. As noted above, in one or more embodiments this step 402 can be executed by performing an audio sweep. Turning briefly to FIG. 6, illustrated therein is one method of performing an audio sweep.

At step 601, one or more audio output devices of the electronic device 100 delivers or reproduces a predefined acoustic output, which is received by one or more microphones of the electronic device. Illustrating by example, if each audio transducer 102, 103, 104, 105 of the electronic device 100 includes one audio output device and one microphone, step 601 can include each audio output device delivering the predefined acoustic output to its corresponding microphone. At step 602, the one or more microphones receive the predefined acoustic output delivered by the audio output devices.

At step 603, one or more processors of the electronic device 100 can measure an attenuation of the predefined acoustic output occurring between the one or more audio output devices and the one or more microphones. In this example, audio transducers 102, 105 are completely covered by the pocket 115. Audio transducers 103 and 104 are exposed from the pocket 115. For this embodiment, presume that transducers 102 and 103 are loudspeakers and transducers 104 and 105 are microphones. Accordingly, the signal produced by transducer 103 will arrive at microphone (transducer 104) without any additional attenuation, but will arrive at transducer 105 with more attenuation than it would if the device were not in the pocket 115. The signal produced by transducer 102 will arrive at both transducer 104 and 105 attenuated, however the additional attenuation will not be the same at both microphones. The path from transducer 102 to 105 would be affected by the surface absorption of pocket 115, while the path from transducer 102 to 104 would be affected by the transmission loss through the material of pocket 115. The attenuation due to the pocket for each path is the difference between the unimpeded free-space transfer function between the pair of transducers (or reference transducer to transducer transfer function) and the in-situ transfer function between that same pair of transducers.

Based upon these measurements, the one or more processors can calculate or select the audio signal adjustment function at step 604. The audio signal adjustment function includes response coefficients that, when applied to the one or more audio transducers 102, 103, 104, 105, adjust gain and spectrum of the one or more audio transducers 102, 103, 104, 105 so that they are better able to receive and deliver acoustic energy through the pocket 115. Embodiments of the disclosure contemplate that pockets 115 are very restrictive environments for audio. Accordingly, the audio signal adjustment function determined at step 504 alters the audio gain and transfer function due to the fact that at least some sound has to pass through the pocket material, resulting in level and spectral changes.

It should be noted that attenuation measured as transfer functions may or may not be what is used to create the audio signal adjustment function. Moreover, such transfer functions may not be used to select a predetermined signal adjustment function. Other information, such as the selection of a default audio signal adjustment function when, for example, a light sensor (308) detects that the electronic device is disposed within a pocket 115 may be applied to the one or more audio transducers 102, 103, 104, 105. Other techniques for creating and/or selecting the audio signal adjustment function will be obvious to those of ordinary skill in the art having the benefit of this disclosure.

Figure 10:
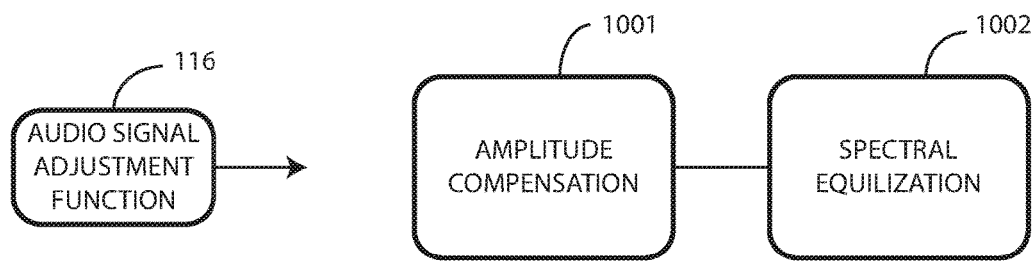
FIG. 10 illustrates explanatory audio signal adjustment functions in accordance with one or more embodiments of the disclosure.

Turning briefly to FIG. 10, illustrated therein is one example of an audio signal adjustment function 116. In one embodiment, the audio signal adjustment function 116 includes amplitude compensation 1001. Following pocket context detection, the application of the audio signal adjustment function increases microphone and speaker gain so that covered microphones and speakers may once again detect acoustic energy from the outside environment and communicate with the user acoustically to overcome sound attenuation due to pocket.

In one embodiment, the audio signal adjustment function 116 also includes spectral equalization 1002. After performing an audio sweep occurring, an inverse function can be applied to obtain correction factors specific to clothes impacting audio "spectral function" if one transducer is known to be inside of the pocket 115 and one is known to be outside of the pocket 115. Such is the case with audio output transducer 103 and microphone (transducer 105). If both transducers are determined to be in the pocket 115, the transfer function between the transducers will be used to find a predefined audio signal adjustment function 116 associated with but not equal to that transfer function Thus, as shown in FIG. 10, in one or more embodiments the audio signal adjustment function 116 comprises one or more amplitude compensation coefficients, found in the amplitude compensation 1001, and one or more spectral equalization coefficients, found in the spectral equalization 1002.

Turning now back to FIG. 6, it should be noted that in one or more embodiments of the disclosure, some audio transducers could simply be selected, while others are not. Embodiments of the disclosure contemplate that a serious pocket issue caused by pocket placement is the loud rubbing noise detected by microphones, which can overwhelm and/or saturate the microphone diaphragm, thereby preventing it from picking up the lower outside audio sounds. In this illustration, the microphones of audio transducers 102, 105 would probably saturate in this manner. In this illustration output transducer 103 and input transducer 104 could be chosen since they are not impeded by pocket 115. In that case the audio signal adjustment function would be the same for those two transducers as it is when a pocket 115 is not detected.

Embodiments of the disclosure contemplate that one way to deal with the loud rubbing sound is to adaptively select one of the multiple microphones that is least impacted by rubbing based on microphone location and phone orientation. In this example, the input transducer 104 is not covered at all. Accordingly, in one or more embodiments the one or more processors of the electronic device 100 simply select the microphone on the "up-side" of the electronic device 100, which is the input transducer 104 in this example Even when partially covered, this microphone is more likely to be closer to a pocket opening. As such, it is less likely to be rubbing against material. In one or more embodiments, a simple subroutine that looks for clipping on each channel is used to aid in the determination of the microphone with the least amount of rubbing. In an alternative embodiment, high order harmonics are measured to identify a rubbing sound on a particular microphone channel.

As such, as shown in FIG. 6, in one or more embodiments the one or more processors of the electronic device determine which microphone of the plurality of microphones receives a least amount of enclosure noise. In this example, it would be the microphone transducer 103. Once this occurs, in one or more embodiments the one or more processors select the microphone receiving the least amount of enclosure noise to capture audio input from an environment of the electronic device during the enclosed condition.

Figure 7:
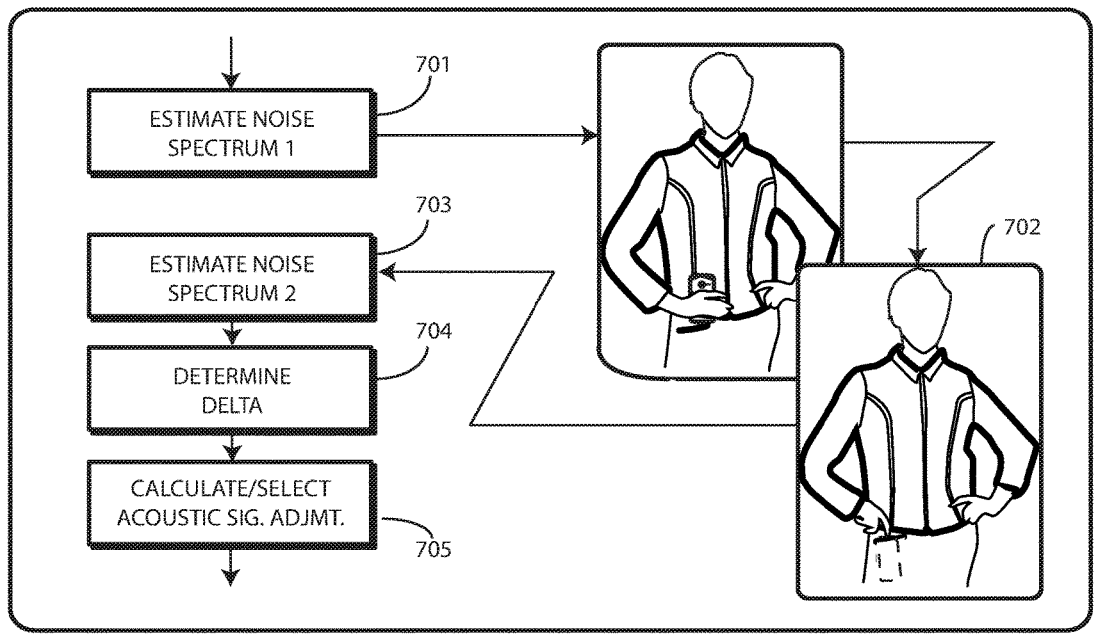
FIG. 7 illustrates one or more method steps in accordance with one or more embodiments of the disclosure.

Turning now to FIG. 7, illustrated therein is an alternate method of determining an audio signal adjustment function for one or more audio transducers of the electronic device in response to the enclosed condition. The method of FIG. 7 looks for a spectral difference in an ambient noise estimate as detected by the audio input transducers. Said differently, the method of FIG. 7 compares an estimated noise index measured by the one or more microphones when the electronic device is within the repository container with another estimated noise index measured by the one or more microphones when the electronic device is outside the repository container.

At step 701, the electronic device estimates a noise spectrum from the signals received from one or more microphones of the audio transducers. This can occur once, continually, or periodically while the electronic device is not in an enclosed condition. This can be stored in memory as a reference noise spectrum.

At step 702, the user places the electronic device in a pocket. This results in the electronic device being in an enclosed condition. When this occurs, at step 703, the electronic device can estimate a noise spectrum from the signals received from one or more microphones while in the enclosed condition. At step 704, the electronic device can compare the noise spectrum from step 703 to a reference noise spectrum from 701. The difference can become the audio signal adjustment function, or a basis thereof, at step 705. Once the in-pocket condition has been confirmed, the material of the container/pocket identified, and the appropriate audio signal adjustment has been applied to the transducers, additional noise spectral measurements can be used to help remove rubbing noise from the microphone using known noise reduction techniques.

Figure 8:
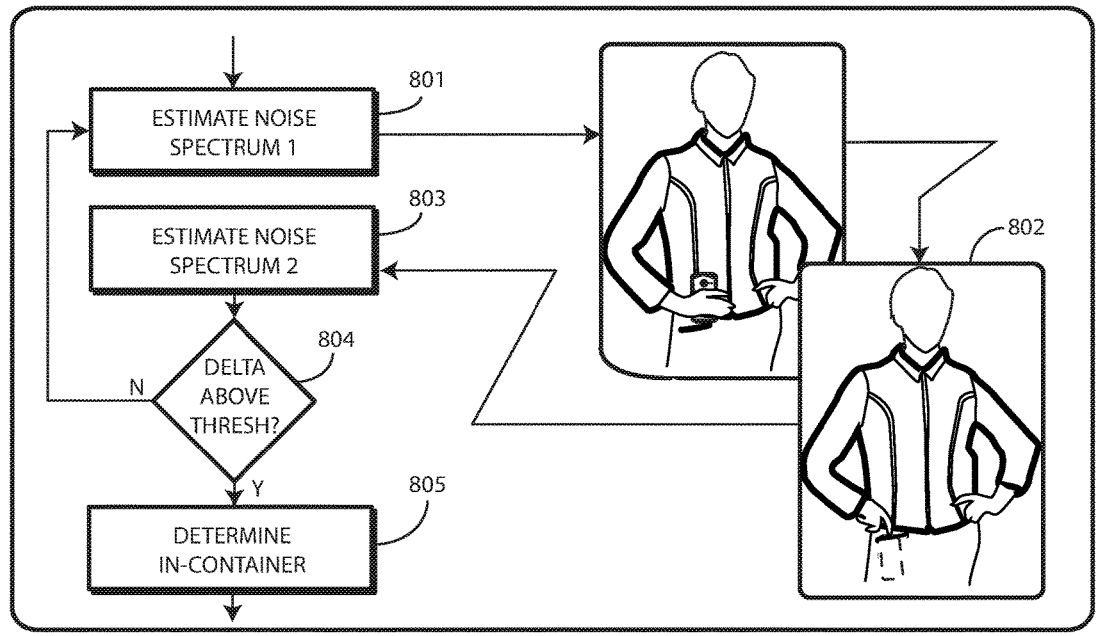
FIG. 8 illustrates one or more method steps in accordance with one or more embodiments of the disclosure.

A similar process can be used to determine whether the electronic device is in the enclosed condition. Turning now to FIG. 8, at step 801, the electronic device estimates a noise spectrum from the signals received from one or more microphones of the audio transducers. This can occur once, continually, or periodically while the electronic device is not in an enclosed condition. This can be stored in memory as a reference noise spectrum.

At step 802, the user places the electronic device in a pocket. At step 703, the noise spectrum estimate procedure from step 801 can continue. Since the electronic device is in the enclosed condition, the noise spectrum from the signals received from one or more microphones while in the enclosed condition will differ from the reference noise spectrum by at least a predefined criterion. Whether this is true can be determined at decision 804 by comparing the noise spectrum to the reference noise spectrum. For example, the noise spectrum from the signals received from one or more microphones while in the enclosed condition will differ from the reference noise spectrum by at least a predefined threshold. Where this is true, the electronic device can conclude that it is in an enclosed condition at step 805.

Turning now back to FIG. 4, once the audio signal adjustment is determined, the method 400 can optionally infer the container pocket material at step 403. As noted above, in addition to being used to determine the audio signal adjustment function, audio sweeps can be used to determine in what type of repository container the electronic device is situated as well in some embodiments. One or more predefined authentication references can be stored in memory. The predefined authentication references can comprise representations of audio signals received during audio sweeps in predefined conditions.

Data representations of conducted audio sweeps can be compared to the one or more predefined authentication references stored in a table in the memory. If a sufficiently matching predefined authentication reference is found, the one or more processors can conclude that the material associated with the sufficiently matching predefined authentication reference is the material of the enclosure. If the sufficiently matching predefined authentication reference corresponds to a denim pocket, for instance, the one or more processors can conclude that the electronic device is situated in a denim pocket, such as in a pocket of a pair of blue jeans.

Thus, in one or more embodiments where the enclosed condition comprises an in-pocket condition, the one or more processors can identify a pocket material by referencing a table of predefined authentication references corresponding to a plurality of pocket materials, each having a corresponding predefined audio signal adjustment function. By comparing the determined audio signal adjustment function to the table of predefined authentication references corresponding to a plurality of pocket materials, the one or more processors can select a closest predefined audio signal adjustment function from the table to identify the material of the pocket. Where no sufficiently matching predefined authentication reference is found in the table in memory, the audio/input processor or the one or more processors can create a new predefined authentication reference, as described above.

At step 404, the method 400 can apply the audio signal adjustment function to signals received from the one or more audio transducers during the enclosed condition. This can occur as previously described above with reference to FIG. 1.

At optional step 404, a motion detector can detect motion. Embodiments of the disclosure contemplate that changing environments can be associated with device motion. Accordingly, in one or more embodiments step 404 comprises detecting, from the one or more sensors, motion of the electronic device. When this occurs, step 406 repeats the actions of step 402 and can determine a different audio signal adjustment function. This results in step 403 applying a different audio signal adjustment function in response to the motion.

At step 407, the method 400 can detect, with the one or more sensors, cessation of the enclosed condition. This can occur, for example, when a user removes the electronic device from a pocket. Where this occurs, step 408 can comprise terminating application of the audio signal adjustment function to the signals received from the one or more audio transducers.

Figure 9:
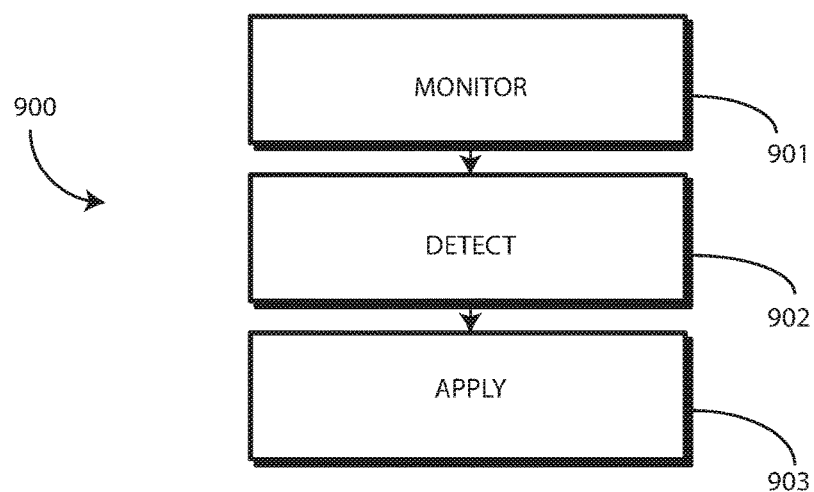
FIG. 9 illustrates one or more method steps in accordance with one or more embodiments of the disclosure.

Turning now to FIG. 9, illustrated therein is another method 900 in accordance with one or more embodiments of the disclosure. At step 901, the method 900 monitors, with one or more processors, an estimated noise index occurring in signals received from one or more microphones of the electronic device. At step 902, the method 900 detects, with the one or more processors, when a change in the estimated noise index exceeds a predefined threshold, an in-container condition of the electronic device. This was described above with reference to FIG. 8. At step 903, the method applies, with the one or more processors, an audio signal adjustment function to the signals received from the one or more microphones to mitigate in-container noise and attenuation occurring in the signals due to the in-container condition.

Figure 11:
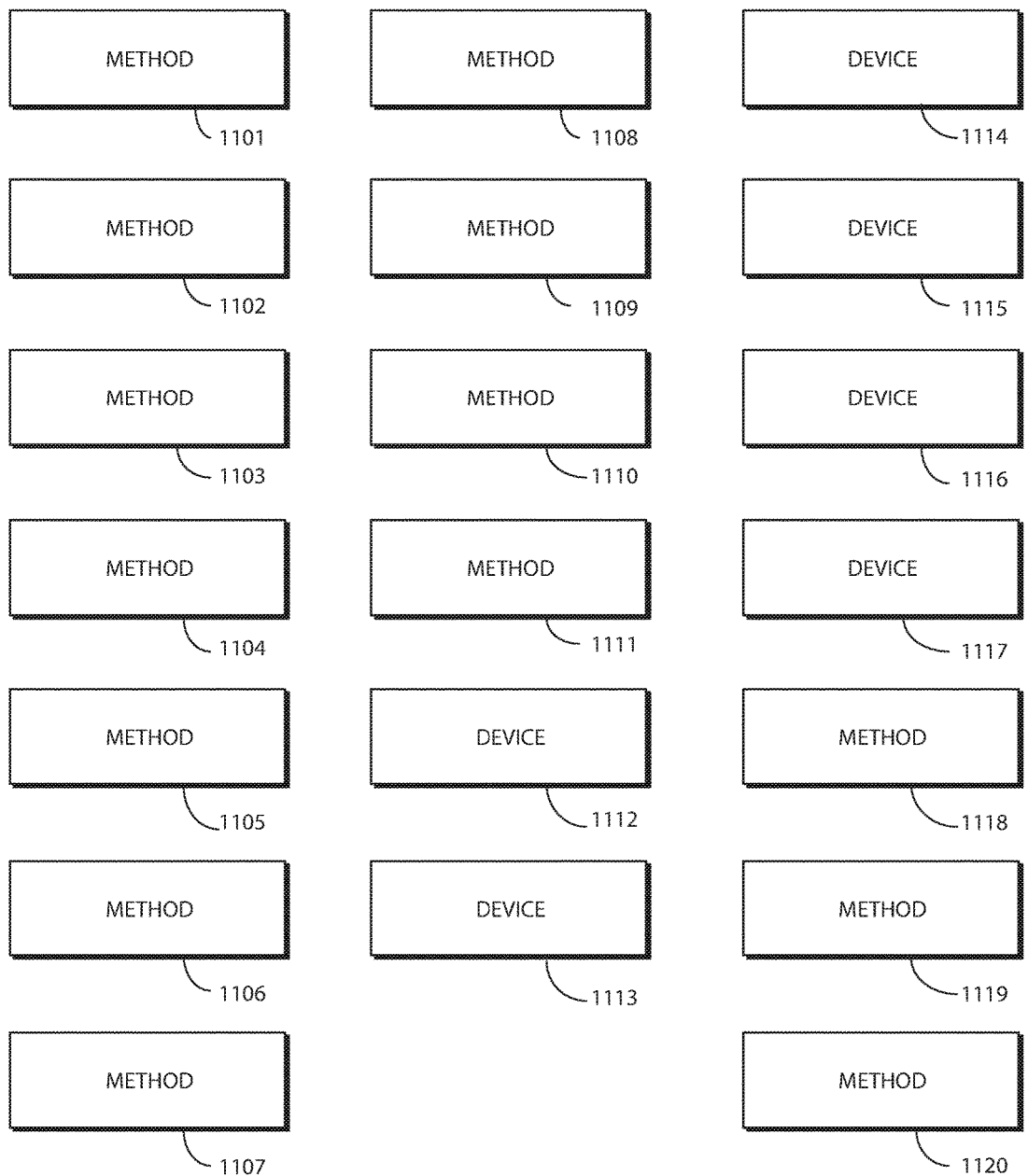
FIG. 11 illustrates various embodiments of the disclosure.

Turning now to FIG. 11, illustrated therein are various embodiments of the disclosure. At 1101, a method in an electronic device comprises detecting, with one or more sensors of the electronic device, an enclosed condition. At 1101, the method comprises determining, with one or more processors, an audio signal adjustment function for one or more audio transducers of the electronic device in response to the enclosed condition. At 1101, the method comprises applying, with the one or more processors, the audio signal adjustment function to signals received from the one or more audio transducers during the enclosed condition.

At 1102, determination of the audio signal adjustment function at 1101 comprises delivering, from one or more audio output devices, a predefined acoustic output to one or more microphones. At 1102, determination of the audio signal adjustment function at 1101 comprises measuring, with the one or more processors, attenuation of the predefined acoustic output occurring between the one or more audio output devices and the one or more microphones.

At 1103, determination of the audio signal adjustment function at 1101 comprises estimating, with the one or more processors, a noise spectrum from the signals received from one or more microphones while in the enclosed condition. At 1103, determination of the audio signal adjustment function at 1101 comprises comparing the noise spectrum to a reference noise spectrum stored within a memory of the electronic device. At 1104, the reference noise spectrum of 1103 comprises a noise spectrum estimate determined prior to the enclosed condition.

At 1105, detection of the enclosed condition of 1101 comprises estimating, with the one or more processors, a noise spectrum from the signals received from one or more microphones while in the enclosed condition. At 1105, detection of the enclosed condition of 1101 comprises comparing the noise spectrum to a reference noise spectrum stored within a memory of the electronic device. At 1105, detection of the enclosed condition of 1101 comprises determining that a difference between the reference noise spectrum and the noise spectrum exceeds at least one predefined criterion.

At 1106, the enclosed condition of 1101 comprises an in-pocket condition, further comprising identifying, with the one or more processors, a pocket material by referencing a table comprising a plurality of pocket materials, each having a corresponding predefined audio signal adjustment function. At 1107, the method of 1106 further comprises selecting a closest predefined audio signal adjustment function from the table, wherein the applying comprises applying the closest predefined audio signal adjustment function to the signals received from one or more microphones.

At 1108, the method of 1106 further comprises failing to find a sufficiently matching predefined audio signal adjustment function in the table. At 1108, the method of 1106 further comprises recording the audio signal adjustment function in the table as a new audio signal adjustment function.

At 1109, the method of 1101 further comprises also detecting, with the one or more sensors, cessation of the enclosed condition. At 1109, the method of 1101 also comprises terminating application of the audio signal adjustment function to the signals received from the one or more audio transducers.

At 1110, the method of 1101 further comprises detecting, with the one or more sensors, motion of the electronic device. At 1110, the method of 1101 further comprises repeating the determining the audio signal adjustment function and the applying the audio signal adjustment function to the signals in response to detecting the motion.

At 1111, the one or more audio transducers of 1101 comprise a plurality of microphones. At 1111, the method of 1101 further comprises determining, with the one or more processors, which microphone of the plurality of microphones receives a least amount of enclosure noise. At 1111, the method of 1101 further comprises selecting, with the one or more processors, the microphone receiving the least amount of enclosure noise to capture audio input from an environment of the electronic device during the enclosed condition.

At 1112, an electronic device comprises one or more microphones. At 1112, the electronic device comprises one or more sensors. At 1112, the electronic device comprises one or more processors operable with the one or more microphones and the one or more sensors. At 1112, the one or more processors, upon the one or more sensors detecting the electronic device is disposed within a repository container, apply an audio signal adjustment function to signals received from the one or more microphones, thereby mitigating noise in the signals caused by the repository container.

At 1113, the electronic device of 1112 further comprises one or more audio output devices. At 1113, the one or more processors determine the audio signal adjustment function by measuring attenuation of a predefined acoustic output from the one or more audio output devices when received by the one or more microphones.

At 1114, the one or more processors of 1112 determine the audio signal adjustment function by comparing an estimated noise index measured by the one or more microphones when the electronic device is within the repository container with another estimated noise index measured by the one or more microphones when the electronic device is outside the repository container. At 1115, the audio signal adjustment function of 1112 comprises one or more amplitude compensation coefficients and one or more spectral equalization coefficients.

At 1116, the one or more processors of 1115 further detect, from the one or more sensors, motion of the electronic device. At 1116, the one or more processors of 1115 further apply a different audio signal adjustment function in response to the motion.

At 1117, the one or more sensors of 1112 detect the electronic device is within the repository container when a difference between an estimated noise index measured by the one or more microphones when the electronic device is within the repository container, and another estimated noise index measured by the one or more microphones when the electronic device is outside the repository container, exceeds a predefine threshold. At 1117, the one or more processors of 1112 determine the audio signal adjustment function by measuring attenuation of a predefined acoustic output from the electronic device when received by the one or more microphones.

At 1118, a method in an electronic device comprises monitoring, with one or more processors, an estimated noise index occurring in signals received from one or more microphones of the electronic device. At 1118, the method comprises detecting, with the one or more processors, when a change in the estimated noise index exceeds a predefined threshold, an in-container condition of the electronic device. At 1118, the method comprises applying, with the one or more processors, an audio signal adjustment function to the signals received from the one or more microphones to mitigate in-container noise occurring in the signals due to the in-container condition.

At 1119, the method of 1118 further comprises delivering, from one or more audio output devices of the electronic device, a predefined acoustic output to the one or more microphones, and measuring, with the one or more processors, attenuation of the predefined acoustic output occurring between the one or more audio output devices and the one or more microphones to determine the audio signal adjustment function. At 1120, the in-container condition of 1118 comprises an in-pocket condition, further comprising identifying a pocket material of a pocket causing the in-pocket condition.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims. Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims.

What is claimed is:

1. A method in an electronic device, the method comprising:
   detecting, with one or more sensors of the electronic device, an enclosed condition of the electronic device;
   determining, with one or more processors, an audio signal adjustment function for one or more audio transducers of the electronic device in response to the enclosed condition; and
   applying, with the one or more processors, the audio signal adjustment function to signals received from, or delivered to, the one or more audio transducers during the enclosed condition.

2. The method of claim 1, wherein the determining the audio signal adjustment function comprises:
   delivering, from one or more audio output devices, a predefined acoustic output to one or more microphones; and
   measuring, with the one or more processors, attenuation of the predefined acoustic output occurring between the one or more audio output devices and the one or more microphones.

3. The method of claim 1, wherein the determining the audio signal adjustment function comprises:
   estimating, with the one or more processors, a noise spectrum from the signals received from one or more microphones while in the enclosed condition; and
   comparing the noise spectrum to a reference noise spectrum stored within a memory of the electronic device.

4. The method of claim 3, wherein the reference noise spectrum comprises a noise spectrum estimate determined prior to the enclosed condition.

5. The method of claim 1, wherein the detecting the enclosed condition comprises:
   estimating, with the one or more processors, a noise spectrum from the signals received from one or more microphones while in the enclosed condition; and
   comparing the noise spectrum to a reference noise spectrum stored within a memory of the electronic device.

6. The method of claim 1, wherein the enclosed condition comprises an in-pocket condition, further comprising identifying, with the one or more processors, a pocket material by referencing a predefined audio signal adjustment function.

7. The method of claim 6, further comprising selecting a closest predefined audio signal adjustment function, wherein the applying comprises applying the closest predefined audio signal adjustment function to the signals received from one or more microphones.

8. The method of claim 6, further comprising:
failing to find a sufficiently matching predefined audio signal adjustment; and
recording the audio signal adjustment function in a table as a new audio signal adjustment function.

9. The method of claim 1, further comprising:
also detecting, with the one or more sensors, cessation of the enclosed condition; and
terminating application of the audio signal adjustment function to the signals received from the one or more audio transducers.

10. The method of claim 1, further comprising:
detecting, with the one or more sensors, motion of the electronic device; and
repeating the determining the audio signal adjustment function and the applying the audio signal adjustment function to the signals in response to detecting the motion.

11. The method of claim 1, wherein the one or more audio transducers comprise a plurality of microphones, further comprising selecting, with the one or more processors, a microphone receiving a least amount of enclosure noise to capture audio input from an environment of the electronic device during the enclosed condition.

12. An electronic device, comprising:
one or more microphones;
one or more loudspeakers;
one or more sensors; and
one or more processors operable with the one or more microphones and the one or more sensors; and
the one or more processors, upon the one or more sensors detecting the electronic device is disposed within a repository container, applying an audio signal adjustment function to one of signals received from the one or more microphones or delivered to the one or more loudspeakers, thereby mitigating noise in the signals caused by the repository container.

13. The electronic device of claim 12, the one or more processors determining the audio signal adjustment function by measuring attenuation of a predefined acoustic output from the one or more loudspeakers when received by the one or more microphones.

14. The electronic device of claim 12, further comprising determining an estimated noise index when the electronic device is disposed within the repository container.

15. The electronic device of claim 12, the audio signal adjustment function comprising one or more amplitude compensation coefficients and one or more spectral equalization coefficients.

16. The electronic device of claim 15, the one or more processors further:
detecting, from the one or more sensors, motion of the electronic device; and
applying a different audio signal adjustment function in response to the motion.

17. The electronic device of claim 12:
the one or more sensors detecting the electronic device is within the repository container when an estimated noise index measured by the one or more microphones when the electronic device is within the repository container and another estimated noise index measured by the one or more microphones when the electronic device is outside the repository container exceeds a predefine threshold; and
the one or more processors determining the audio signal adjustment function by measuring attenuation of a predefined acoustic output from the electronic device when received by the one or more microphones.

18. A method in an electronic device, the method comprising:
monitoring, with one or more processors, an estimated noise index occurring in signals received from one or more microphones of the electronic device;
detecting, with the one or more processors, when a change in the estimated noise index exceeds a predefined threshold, an in-container condition of the electronic device; and
applying, with the one or more processors, an audio signal adjustment function to one of the signals received from the one or more microphones or other signals delivered to one or more audio output devices to mitigate in-container noise occurring due to the in-container condition.

19. The method of claim 18, further comprising delivering, from the one or more audio output devices of the electronic device, a predefined acoustic output to the one or more microphones, and measuring, with the one or more processors, attenuation of the predefined acoustic output occurring between the one or more audio output devices and the one or more microphones to determine the audio signal adjustment function.

20. The method of claim 18, further comprising identifying a material causing the in-container condition.

* * * * *